US012706618B2

(12) United States Patent
Nagumo et al.

(10) Patent No.: US 12,706,618 B2
(45) Date of Patent: Aug. 11, 2026

(54) RADIO FREQUENCY MODULE AND COMMUNICATION DEVICE

(71) Applicant: Murata Manufacturing Co., Ltd., Nagaokakyo (JP)

(72) Inventors: Shoji Nagumo, Nagaokakyo (JP); Hirotsugu Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 581 days.

(21) Appl. No.: 18/302,831

(22) Filed: Apr. 19, 2023

(65) Prior Publication Data

US 2023/0261677 A1 Aug. 17, 2023

Related U.S. Application Data

(63) Continuation of application No. PCT/JP2021/036977, filed on Oct. 6, 2021.

(30) Foreign Application Priority Data

Oct. 28, 2020 (JP) ................................ 2020-180269

(51) Int. Cl.
*H04B 1/00* (2006.01)
*H03H 11/04* (2006.01)
(Continued)

(52) U.S. Cl.
CPC ........... *H04B 1/0064* (2013.01); *H03H 11/04* (2013.01); *H03H 11/28* (2013.01); *H04L 5/14* (2013.01); *H04B 7/0413* (2013.01)

(58) Field of Classification Search
CPC .................................................... H04B 1/0064
See application file for complete search history.

(56) References Cited

U.S. PATENT DOCUMENTS 7,668,521 B2 * 2/2010 Vavelidis ............... H04B 17/22 455/193.1
8,620,252 B2 * 12/2013 Rodal ...................... H03D 7/14 455/313

(Continued)

FOREIGN PATENT DOCUMENTS

JP 2012-169804 A 9/2012
JP 2018-523947 A 8/2018
JP 2019-176452 A 10/2019

OTHER PUBLICATIONS

International Search Report and Written Opinion mailed on Dec. 21, 2021, received for PCT Application PCT/JP2021/036977, filed on Oct. 6, 2021, 17 pages including English Translation.

*Primary Examiner* — Guang W Li
(74) *Attorney, Agent, or Firm* — XSENSUS LLP

(57) ABSTRACT

An RF module includes first and second filters having pass bands corresponding to a TDD band. One low-noise amplifier's input is connected to the first filter and output is connected to a first RF output to provide a TDD band downlink signal. Another low-noise amplifier's input is connected to the second filter and output is connected to a second RF output to provide a TDD band downlink signal. A first switch includes terminals respectively connected to a first antenna connection, the first filter, and an RF input to receive a TDD band uplink signal. A second switch includes terminals respectively connected to a second antenna connection terminal, the second filter, and the RF input. The switches are formed on different dies. The second switch is also connected to the first switch via wiring outside the dies, and the first switch is connected to the RF input via the second switch.

20 Claims, 10 Drawing Sheets

(51) Int. Cl.

| | |
|---|---|
| ***H03H 11/28*** | (2006.01) |
| ***H04L 5/14*** | (2006.01) |
| *H04B 7/0413* | (2017.01) |

(56) References Cited

U.S. PATENT DOCUMENTS

| | | | | |
|---|---|---|---|---|
| 9,431,963 | B2 * | 8/2016 | Wang | H03F 1/26 |
| 11,121,736 | B2 * | 9/2021 | DiTommaso | H04B 1/006 |
| 11,757,476 | B2 * | 9/2023 | Hirobe | H04B 1/0078 455/552.1 |
| 2007/0066254 | A1 * | 3/2007 | Tsuchie | H04B 1/0032 455/183.2 |
| 2014/0024329 | A1 * | 1/2014 | Khlat | H04B 1/0057 455/307 |
| 2014/0038532 | A1 * | 2/2014 | George | H04B 1/006 455/78 |
| 2015/0349722 | A1 * | 12/2015 | Wang | H04B 1/40 330/295 |
| 2017/0012651 | A1 * | 1/2017 | Ellä | H04L 5/1461 |
| 2017/0040947 | A1 * | 2/2017 | Chang | H03F 3/211 |
| 2019/0141698 | A1 * | 5/2019 | Kim | H04W 72/21 |
| 2023/0119087 | A1 * | 4/2023 | Feng | H04B 1/0057 455/552.1 |
| 2024/0056146 | A1 * | 2/2024 | An | H04L 5/1469 |

* cited by examiner

RADIO FREQUENCY MODULE AND COMMUNICATION DEVICE

CROSS-REFERENCE TO RELATED APPLICATIONS

This application is a continuation application of PCT International Application No. PCT/JP2021/036977 filed on Oct. 6, 2021, which is based on and claims priority of Japanese Patent Application No. 2020-180269 filed on Oct. 28, 2020. The entire disclosures of the above-identified applications, including the specifications, drawings, and claims are incorporated herein by reference in their entirety.

BACKGROUND

1. Field

The present disclosure relates to a radio frequency (RF) module and a communication device.

2. Description of the Related Art

A mobile communication device such as a mobile phone may include a plurality of antennas. For example, Japanese Unexamined Patent Application Publication No. 2019-176452 discloses an RF module including a switch for switching between the connection to one of two antennas and the connection to the other.

SUMMARY

In the above related art, however, in Multiple Input Multiple Output (MIMO) wireless communication in which a plurality of antennas are used to realize multipath propagation, it is difficult to secure necessary isolation, and reception sensitivity may decrease.

Accordingly, the present disclosure provides a radio frequency module and a communication device that are capable of improving reception sensitivity in MIMO wireless communication.

A radio frequency module according to an aspect of the present disclosure includes a first filter having a pass band including a time division duplex (TDD) band, and a second filter having a pass band including the TDD band. A first low-noise amplifier includes an input terminal connected to one end of the first filter, and an output terminal connected to a first radio frequency output terminal to externally provide a downlink signal of the TDD band A second low-noise amplifier includes an input terminal connected to one end of the second filter, and an output terminal connected to a second radio frequency output terminal to externally provide a downlink signal of the TDD band A first switch includes a first terminal connected to a first antenna connection terminal, a second terminal connected to the other end of the first filter, and a third terminal connected to a radio frequency input terminal to receive an external uplink signal of the TDD band A second switch includes a fourth terminal connected to a second antenna connection terminal, a fifth terminal connected to the other end of the second filter, and a sixth terminal connected to the radio frequency input terminal. The first switch is formed in a first die, and the second switch is formed in a second die different from the first die. The second switch includes a seventh terminal connected to the third terminal of the first switch via a wiring line disposed outside the first die and outside the second die. The third terminal of the first switch is connected to the radio frequency input terminal via the second switch.

A radio frequency module according to an aspect of the present disclosure includes a first filter having a pass band including a timed division duplex (TDD) band, and a second filter having a pass band including the TDD band. A first low-noise amplifier includes an input terminal connected to one end of the first filter, and an output terminal connected to a first radio frequency output terminal to externally provide a downlink signal of the TDD band. A second low-noise amplifier includes an input terminal connected to one end of the second filter, and an output terminal connected to a second radio frequency output terminal to externally provide a downlink signal of the TDD band. A first switch is configured to switch between connection and disconnection between a first antenna connection terminal and the other end of the first filter, and a second switch is configured to switch between connection and disconnection between a second antenna connection terminal and the other end of the second filter. A third switch is configured to switch between connection and disconnection between the first antenna connection terminal and a radio frequency input terminal for receiving an uplink signal of the band from an outside, and a fourth switch is configured to switch between connection and disconnection between the second antenna connection terminal and the radio frequency input terminal. The first antenna connection terminal and the second antenna connection terminal are connected to each other via the third switch and the fourth switch.

A radio frequency module according to an aspect of the present disclosure includes a first filter having a pass band including a time division duplex (TDD) band, and a second filter having a pass band including the TDD band. A first low-noise amplifier includes an input terminal connected to one end of the first filter, and an output terminal connected to a first radio frequency output terminal to externally provide a downlink signal of the TDD band. A second low-noise amplifier includes an input terminal connected to one end of the second filter, and an output terminal connected to a second radio frequency output terminal to externally provide a downlink signal of the TDD band. A switch circuit includes a first terminal connected to a first antenna connection terminal, a second terminal connected to the other end of the first filter, a third terminal connected to a radio frequency input terminal to receive an external uplink signal of the TDD band, a fourth terminal connected to a second antenna connection terminal, a fifth terminal connected to the other end of the second filter, a first switch configured to switch between connection and disconnection between the first terminal and the second terminal, a second switch configured to switch between connection and disconnection between the fourth terminal and the fifth terminal, a third switch configured to switch between connection and disconnection between the first terminal and the third terminal, and a fourth switch configured to switch between connection and disconnection between the third terminal and the fourth terminal. The switch circuit is formed in one die including a plurality of layers. The plurality of layers include a first layer in which the first switch is disposed, a second layer in which the third switch and the fourth switch are disposed, and a third layer in which the second switch is disposed. The second layer is disposed between the first layer and the third layer.

A radio frequency module according to an aspect of the present disclosure is capable of improving reception sensitivity in MIMO wireless communication.

DETAILED DESCRIPTION

Figure 1:
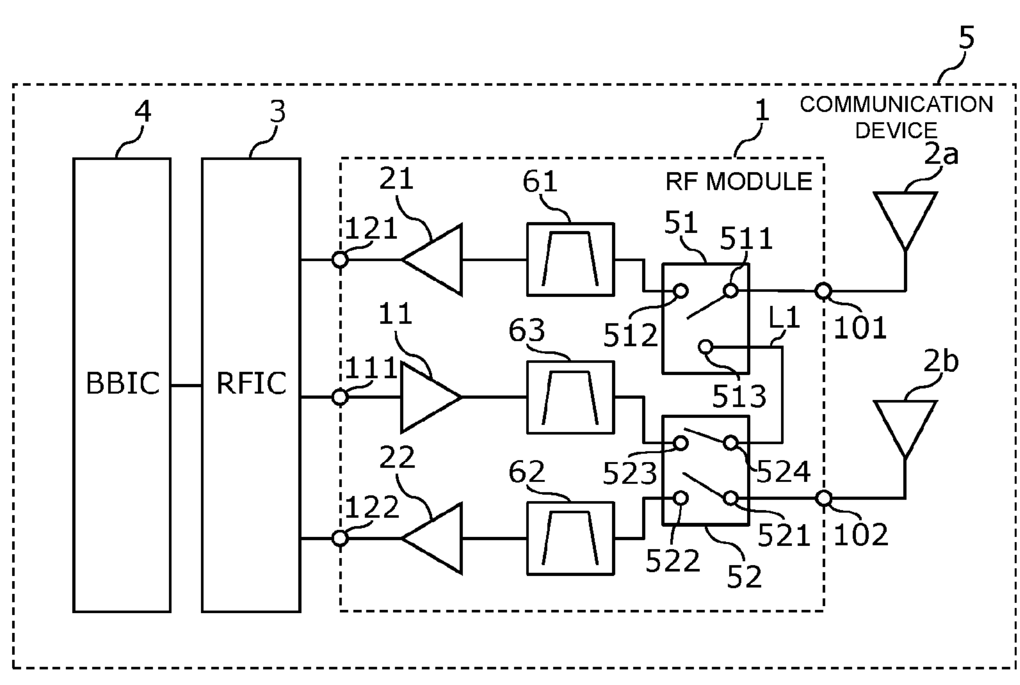
FIG. 1 is a circuit configuration diagram of a radio frequency (RF) module and a communication device according to a first exemplary embodiment.

Hereinafter, exemplary embodiments of the present disclosure will be described in detail with reference to the drawings. The exemplary embodiments described below each illustrate a general or specific example. The numerical values, shapes, materials, constituent elements, the arrangement and connection manner of the constituent elements, and so forth described in the following exemplary embodiments are merely examples, and are not limiting upon the present disclosure.

The drawings are schematic diagrams drawn with emphasis, omission, or ratio adjustment performed as appropriate in order to illustrate aspects of the present disclosure. The illustration therein is not necessarily strict, and may be different from actual shapes, positional relationships, and ratios. In the drawings, constituent elements that are substantially the same are denoted by the same reference numerals, and a repeated description thereof may be omitted or simplified.

In the drawings referred to below, an x-axis and a y-axis are axes orthogonal to each other on a plane parallel to main surfaces of a module substrate. Specifically, in a case where the module substrate has a rectangular shape in plan view, the x-axis is parallel to a first side of the module substrate, and the y-axis is parallel to a second side orthogonal to the first side of the module substrate. A z-axis is an axis perpendicular to the main surfaces of the module substrate. The positive direction thereof indicates an upward direction, and the negative direction thereof indicates a downward direction.

In the circuit configurations of the present disclosure, "connected" includes not only a direct connection using a connection terminal and/or a wiring conductor, but also an electrical connection via another circuit element. "Connected between A and B" means connected to both A and B between A and B.

Regarding the arrangement of components in the present disclosure, "plan view" means viewing of an object orthogonally projected onto an xy plane from the positive side of the z-axis. "A is disposed between B and C in plan view" means that at least one of a plurality of line segments connecting a certain point in the region of B projected onto the xy plane and a certain point in the region of C projected onto the xy plane passes through the region of A projected onto the xy plane. In addition, terms indicating the relationships between elements, such as "parallel" and "perpendicular", terms indicating the shapes of elements, such as "rectangular", and numerical ranges do not represent only strict meanings, but include substantially equivalent ranges, for example, an error of about several percent.

"A component is disposed on a substrate" includes not only that the component is disposed on the substrate so as to be in contact with the substrate, but also that the component is disposed above the substrate without being in contact with the substrate (for example, the component is stacked on another component disposed on the substrate) and that the component is partially or entirely embedded in the substrate. "A component is disposed on a main surface of a substrate" includes not only that the component is disposed on the main surface of the substrate so as to be in contact with the main surface, but also that the component is disposed above the main surface without being in contact with the main surface and that the component is partially embedded in the substrate from the main surface side.

First Exemplary Embodiment

1.1. Circuit Configurations of RF Module 1 and Communication Device 5

A communication device 5 according to a first exemplary embodiment is a mobile terminal that supports 2×2 downlink Multiple Input Multiple Output (MIMO). The circuit configuration of the communication device 5 will be described with reference to FIG. 1. FIG. 1 is a circuit configuration diagram of a radio frequency (RF) module 1 and the communication device 5 according to the first exemplary embodiment.

1.1.1. Circuit Configuration of Communication Device 5

As illustrated in FIG. 1, the communication device 5 according to the exemplary embodiment includes the RF module 1, antennas 2*a* and 2*b*, a radio frequency integrated circuit (RFIC) 3, and a baseband integrated circuit (BBIC) 4.

The RF module 1 transmits RF signals between the antennas 2*a* and 2*b* and the RFIC 3. The internal configuration of the RF module 1 will be described below.

The antennas 2*a* and 2*b* are connected to antenna connection terminals 101 and 102 of the RF module 1, respectively. The antennas 2*a* and 2*b* each transmit an RF signal output from the RF module 1, and receive an RF signal from the outside and output the RF signal to the RF module 1.

The RFIC 3 is an example of a signal processing circuit that processes an RF signal. Specifically, the RFIC 3 performs signal processing such as down-conversion on an RF downlink signal received via a reception path of the RF module 1, and outputs a downlink signal generated through the signal processing to the BBIC 4. In addition, the RFIC 3 performs signal processing such as up-conversion on an uplink signal received from the BBIC 4, and outputs an RF uplink signal generated through the signal processing to a transmission path of the RF module 1. The RFIC 3 includes a control unit that controls a switch, an amplifier, and so forth included in the RF module 1. Some or all of the functions of the control unit of the RFIC 3 may be implemented in the outside of the RFIC 3, for example, in the BBIC 4 or the RF module 1.

The BBIC 4 is a baseband signal processing circuit that performs signal processing by using an intermediate frequency band lower than the frequency of an RF signal transmitted by the RF module 1. The signal to be processed by the BBIC 4 may be, for example, an image signal for displaying an image, and/or an audio signal for a telephone call using a speaker.

In the communication device 5 according to the exemplary embodiment, the antennas 2*a* and 2*b* and the BBIC 4 are not essential constituent elements.

1.1.2. Circuit Configuration of RF Module 1

Next, the circuit configuration of the RF module 1 will be described. As illustrated in FIG. 1, the RF module 1 includes a power amplifier (PA) 11, low-noise amplifiers 21 and 22, switches 51 and 52, filters 61 to 63, the antenna connection terminals 101 and 102, an RF input terminal 111, and RF output terminals 121 and 122.

The antenna connection terminal 101 is an example of a first antenna connection terminal, and is connected to the antenna 2*a*. The antenna connection terminal 102 is an example of a second antenna connection terminal, and is connected to the antenna 2*b*.

The RF input terminal 111 is a terminal for receiving an RF uplink signal from the outside of the RF module 1. In the exemplary embodiment, the RF input terminal 111 is a terminal for receiving, from the RFIC 3, a sounding reference signal (SRS) of band A in which time division duplex (TDD) is used as a duplex mode. The signal to be received by the RF input terminal 111 is not limited to an SRS.

Band A is a frequency band for a communication system constructed using the radio access technology (RAT). Band A is defined in advance by standardizing bodies (for example, 3rd Generation Partnership Project (3GPP), Institute of Electrical and Electronics Engineers (IEEE), and so forth). Examples of the communication system include a 5th Generation New Radio (5G NR) system, a Long Term Evolution (LTE) system, and a Wireless Local Area Network (WLAN) system. Band A may be, but is not limited to, n41, n77, n78, or n79 for 5G NR, for example.

An SRS is one of reference signals used in 5G NR, and is an uplink reference signal for measuring, by a base station, the channel quality, reception timing, and so forth of the uplink. The SRS is used to estimate how an RF signal propagates from the base station to a terminal as a result of being affected by multipath propagation and distance attenuation. The SRS is used for resource scheduling, link adaptation, Massive MIMO, beam management, and so forth.

The RF output terminals 121 and 122 are an example of a first RF output terminal and an example of a second RF output terminal, respectively, and are terminals for providing RF downlink signals to the outside of the RF module 1. In the exemplary embodiment, the RF output terminals 121 and 122 are terminals for providing downlink signals of band A to the RFIC 3.

The PA 11 is capable of amplifying an SRS received by the RF input terminal 111. The PA 11 is connected between the RF input terminal 111 and the filter 63. Specifically, the PA 11 includes an input terminal connected to the RF input terminal 111, and includes an output terminal connected to the filter 63.

The configuration of the PA 11 is not particularly limiting. The PA 11 may have a single-stage configuration or a multi-stage configuration. For example, the PA 11 may include a plurality of amplifier elements connected in cascade. The PA 11 may convert an RF signal into a differential signal (i.e., a complementary signal) to amplify the RF signal. Such a PA 11 may be referred to as a differential amplifier.

The low-noise amplifier 21 is an example of a first low-noise amplifier, and is capable of amplifying a downlink signal of band A received by the antenna connection terminal 101. The low-noise amplifier 21 is connected between the filter 61 and the RF output terminal 121. Specifically, the low-noise amplifier 21 includes an input terminal connected to the filter 61, and includes an output terminal connected to the RF output terminal 121.

The low-noise amplifier 22 is an example of a second low-noise amplifier, and is capable of amplifying a downlink signal of band A received by the antenna connection terminal 102. The low-noise amplifier 22 is connected between the filter 62 and the RF output terminal 122. Specifically, the low-noise amplifier 22 includes an input terminal connected to the filter 62, and includes an output terminal connected to the RF output terminal 122.

The configuration of each of the low-noise amplifiers 21 and 22 is not particularly limited. For example, each of the low-noise amplifiers 21 and 22 may have either a single-stage configuration or a multi-stage configuration, and may be a differential amplifier.

The filter 61 is an example of a first filter, and has a pass band including band A. The filter 61 is connected between the antenna connection terminal 101 and the low-noise amplifier 21. Specifically, the filter 61 includes one end connected to the input terminal of the low-noise amplifier 21, and includes the other end connected to the antenna connection terminal 101 via the switch 51.

The filter 62 is an example of a second filter, and has a pass band including band A. The filter 62 is connected between the antenna connection terminal 102 and the low-noise amplifier 22. Specifically, the filter 62 includes one end connected to the input terminal of the low-noise amplifier 22, and includes the other end connected to the antenna connection terminal 102 via the switch 52.

The filter 63 is an example of a third filter, and has a pass band including band A. The filter 63 is connected between the PA 11 and the antenna connection terminals 101 and 102. Specifically, the filter 63 includes one end connected to the output terminal of the PA 11. The filter 63 includes the other end connected to the antenna connection terminal 101 via the switches 51 and 52, and to the antenna connection terminal 102 via the switch 52.

The switch 51 is an example of a first switch, and includes terminals 511 to 513. The terminal 511 is an example of a first terminal, and is connected to the antenna connection terminal 101. The terminal 512 is an example of a second terminal, and is connected to the filter 61. The terminal 513 is an example of a third terminal, and is connected to the filter 63 via the switch 52.

With this connection configuration, the switch 51 is capable of connecting the terminal 511 to either the terminal 512 or the terminal 513 in response to, for example, a control signal from the RFIC 3. That is, the switch 51 is capable of switching the connection destination of the antenna 2*a* between the filters 61 and 63. The switch 51 includes, for example, a single-pole double-throw (SPDT) switch circuit.

The switch 52 is an example of a second switch, and includes terminals 521 to 524. The terminal 521 is an example of a fourth terminal, and is connected to the antenna connection terminal 102. The terminal 522 is an example of a fifth terminal, and is connected to the filter 62. The terminal 523 is an example of a sixth terminal, and is connected to the filter 63. The terminal 524 is an example of a seventh terminal, and is connected to the terminal 513 of the switch 51 via a wiring line L1.

With this connection configuration, the switch 52 is capable of connecting the terminal 521 to either the terminal 522 or the terminal 523 in response to, for example, a control signal from the RFIC 3. That is, the switch 52 is capable of switching the connection destination of the antenna 2*b* between the filters 62 and 63. Furthermore, the switch 52 is capable of connecting the terminal 524 to the terminal 523.

Some of the circuit elements illustrated in FIG. 1 need not necessarily be included in the RF module 1. For example, the RF module 1 need not necessarily include the PA 11 and the filter 63.

1.2. Arrangement of Components of RF Module 1

Next, an example of the arrangement of components of the RF module 1 having the above-described configuration will be described in detail with reference to FIG. 2 and FIG. 3.

Figure 2:
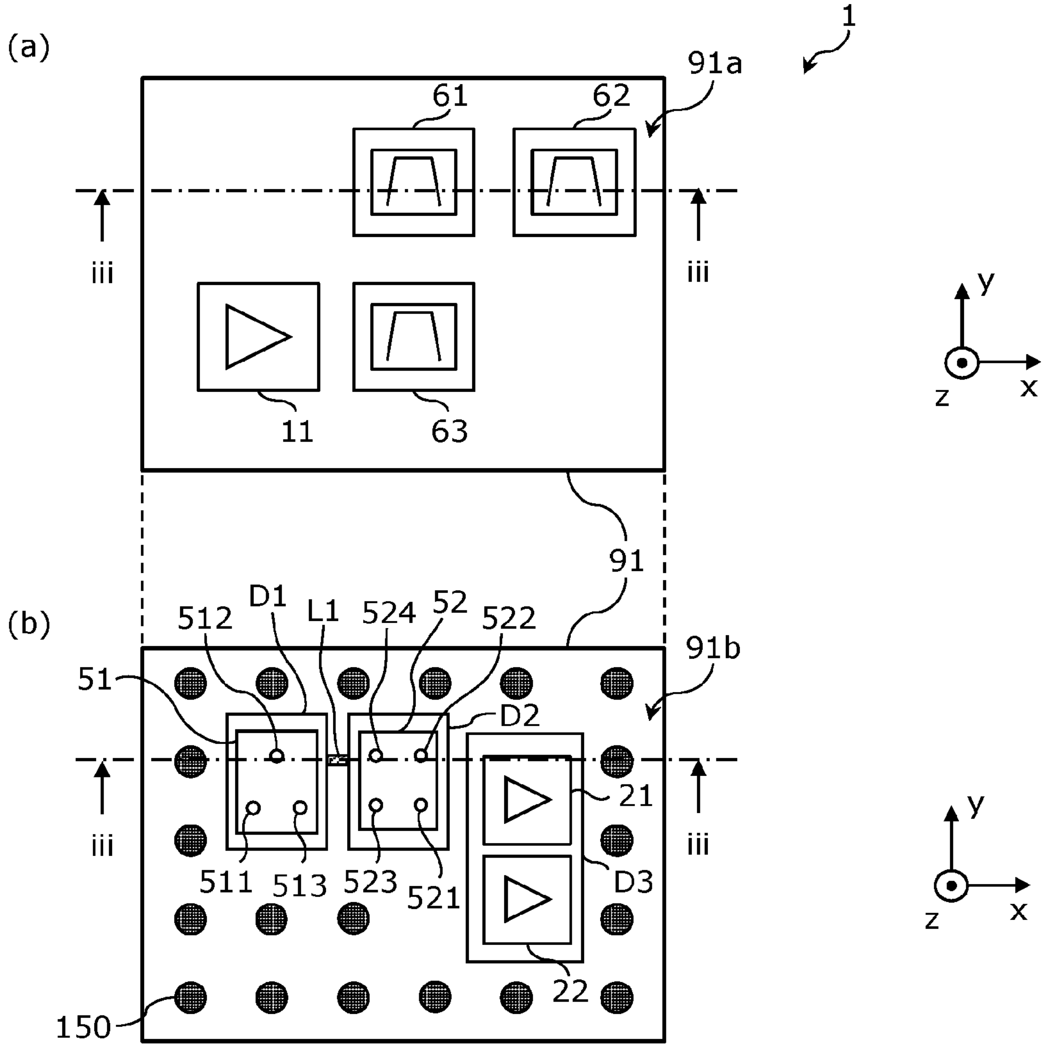
FIG. 2 is a plan view of the RF module according to the first exemplary embodiment.

FIG. 2 is a plan view of the RF module 1 according to the first exemplary embodiment. Specifically, in FIG. 2, part (a) illustrates a main surface 91*a* of a module substrate 91 viewed from the positive side of the z-axis, and part (b) illustrates a main surface 91*b* of the module substrate 91 viewed through from the positive side of the z-axis. FIG. 3 is a sectional view of the RF module 1 according to the first exemplary embodiment. The section of the RF module 1 in FIG. 3 is a section taken along the line iii-iii in FIG. 2.

Figure 3:
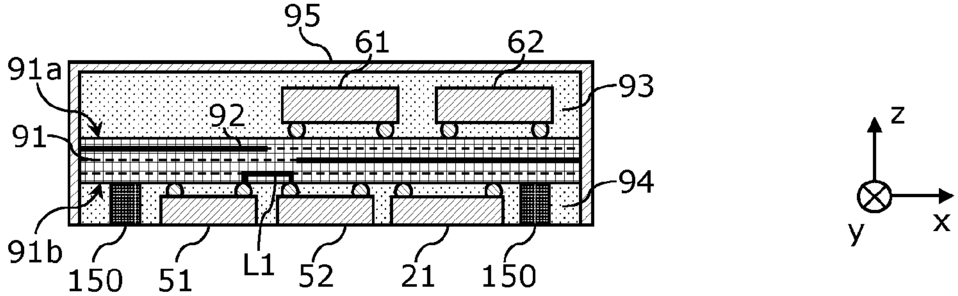
FIG. 3 is a sectional view of the RF module according to the first exemplary embodiment.

As illustrated in FIG. 2 and FIG. 3, the RF module 1 further includes the module substrate 91, resin members 93 and 94, a shield electrode layer 95, and a plurality of post electrodes 150, in addition to the circuit components including the circuit elements illustrated in FIG. 1. In FIG. 2, the illustration of the resin members 93 and 94 and the shield electrode layer 95 is omitted.

The module substrate 91 has the main surfaces 91*a* and 91*b* opposed to each other. In the exemplary embodiment, the module substrate 91 has a rectangular shape in plan view, but the shape of the module substrate 91 is not limited thereto. The module substrate 91 may be, but is not limited to, a low temperature co-fired ceramics (LTCC) substrate or a high temperature co-fired ceramics (HTCC) substrate having a multilayer structure of a plurality of dielectric layers, a component built-in substrate, a substrate including a redistribution layer (RDL), a printed circuit board, or the like, for example. A ground electrode pattern 92 is disposed in the module substrate 91.

The PA 11 and the filters 61 to 63 are disposed on the main surface 91*a*. The main surface 91*a* and the components on the main surface 91*a* are covered with the resin member 93. The main surface 91*a* may be referred to as an upper surface or a front surface.

The filters 61 to 63 may be, but are not limited to, surface acoustic wave (SAW) filters, bulk acoustic wave (BAW) filters, LC resonant filters, or dielectric filters, for example.

The resin member 93 covers the main surface 91*a* and the components on the main surface 91*a*. The resin member 93 has a function of ensuring reliability, such as mechanical strength and moisture resistance, of the components on the main surface 91*a*. The resin member 93 need not necessarily be provided.

The switches 51 and 52, the low-noise amplifiers 21 and 22, and the plurality of post electrodes 150 are disposed on the main surface 91*b*. The main surface 91*b* and the components on the main surface 91*b* are covered with the resin member 94. The main surface 91*b* may be referred to as a lower surface or a rear surface of the module substrate 91.

The switch 51 is formed in a die D1. The die D1 is an example of a first die, and is a small block made of a semiconductor material in which the switch 51 is formed. The die D1 may also be referred to as a semiconductor chip.

The switch 52 is formed in a die D2 different from the die D1. The die D2 is an example of a second die, and is a small block made of a semiconductor material in which the switch 52 is formed. The die D2 may also be referred to as a semiconductor chip. The switch 52 is connected to the switch 51 via the wiring line L1 disposed outside the die D1 and outside the die D2.

The wiring line L1 may be, but is not limited to, a wiring pattern disposed on and/or in the module substrate 91, for example.

In plan view, the terminal 513 of the switch 51 is disposed between the terminal 511 of the switch 51 and the terminal 521 of the switch 52. In plan view, the terminal 523 of the switch 52 is disposed between the terminal 511 of the switch 51 and the terminal 521 of the switch 52.

The low-noise amplifiers 21 and 22 are formed in a die D3. The low-noise amplifiers 21 and 22 need not necessarily be formed in one die, and may be separately formed in two dies. The low-noise amplifier 21 and/or the low-noise amplifier 22 may be formed in the die D1 or the die D2.

The dies D1 to D3 are made of, for example, complementary metal oxide semiconductor (CMOS), and specifically may be manufactured by a silicon on insulator (SOI) process. This makes it possible to manufacture the dies D1 to D3 at low cost. The dies D1 to D3 may be made of at least one of GaAs, SiGe, or GaN. This makes it possible to obtain high-quality switches 51 and 52 or high-quality low-noise amplifiers 21 and 22.

The plurality of post electrodes 150 include a ground terminal in addition to the antenna connection terminals 101 and 102, the RF input terminal 111, and the RF output terminals 121 and 122 illustrated in FIG. 1. The plurality of post electrodes 150 are each connected to an input/output terminal and/or a ground terminal or the like on a mother substrate disposed in the negative direction of the z-axis of the RF module 1. A plurality of bump electrodes may be used instead of the plurality of post electrodes 150.

The resin member 94 covers the main surface 91*b* and the components on the main surface 91*b*. The resin member 94 has a function of ensuring reliability, such as mechanical strength and moisture resistance, of the components on the main surface 91*b*. The resin member 94 need not necessarily be provided.

The shield electrode layer 95 is a metal thin film formed by, for example, sputtering, and is disposed so as to cover the upper surface and the side surfaces of the resin member 93, the side surfaces of the module substrate 91, and the side surfaces of the resin member 94. The shield electrode layer 95 is set to a ground potential, and reduces external noise entering the circuit components of the RF module 1.

The configuration of the RF module 1 illustrated in FIG. 2 and FIG. 3 is illustrative, and is not restrictive. For example, the RF module 1 need not necessarily include the resin members 93 and 94 and the shield electrode layer 95. The RF module 1 may include a plurality of bump electrodes instead of the plurality of post electrodes 150.

1.3. Connection States of RF Module 1

Next, a description will be given of a plurality of connection states of the RF module 1 having the above-described configuration, and signal flows in the individual connection states.

Figure 4:
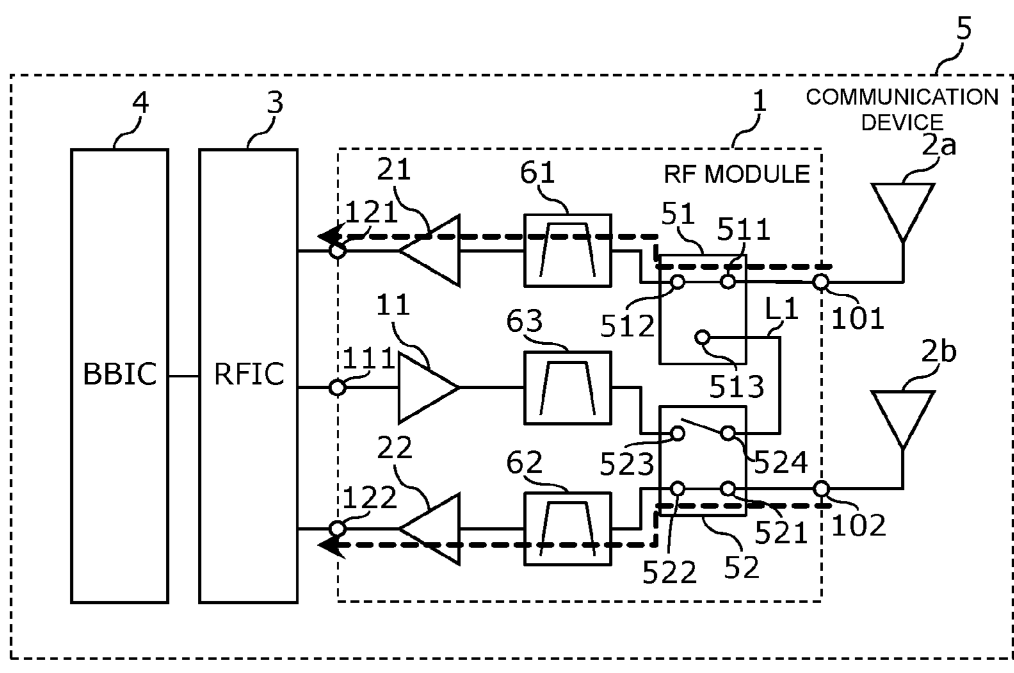
FIG. 4 is a circuit configuration diagram illustrating a first connection state of the RF module according to the first exemplary embodiment.

First, a description will be given of a first connection state for receiving downlink signals of band A by MIMO via both the antennas 2*a* and 2*b*, and signal flows in the first connection state, with reference to FIG. 4. FIG. 4 is a circuit configuration diagram illustrating the first connection state of the RF module 1 according to the first embodiment.

In FIG. 4 and subsequent similar figures, dashed arrows indicate signal flows.

The RFIC 3 is capable of implementing the first connection state in FIG. 4 by controlling the individual switches of the RF module 1. In the first connection state, the switch 51 connects the terminal 511 to the terminal 512 and does not connect the terminal 511 to the terminal 513. Furthermore, the switch 52 connects the terminal 521 to the terminal 522 and does not connect the terminal 521 to the terminal 523. The switch 52 may also connect, but need not connect, the terminal 524 to the terminal 523.

As a result, a downlink signal of band A is transmitted from the antenna 2*a* to the RFIC 3 via the antenna connection terminal 101, the switch 51, the filter 61, the low-noise amplifier 21, and the RF output terminal 121. Furthermore, a downlink signal of band A is transmitted from the antenna 2*b* to the RFIC 3 via the antenna connection terminal 102, the switch 52, the filter 62, the low-noise amplifier 22, and the RF output terminal 122.

Figure 5:
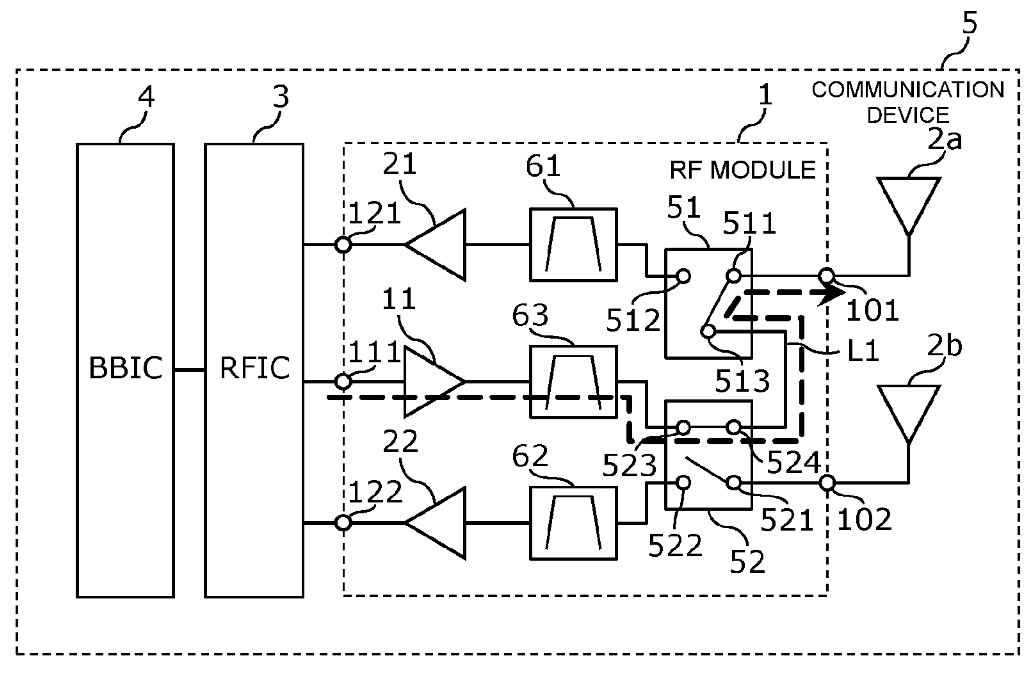
FIG. 5 is a circuit configuration diagram illustrating a second connection state of the RF module according to the first exemplary embodiment.

Next, a description will be given of a second connection state for transmitting an SRS of band A via the antenna 2*a*, and a signal flow in the second connection state, with reference to FIG. 5. FIG. 5 is a circuit configuration diagram illustrating the second connection state of the RF module 1 according to the first exemplary embodiment.

The RFIC 3 is capable of implementing the second connection state in FIG. 5 by controlling the individual switches of the RF module 1. In the second connection state, the switch 51 connects the terminal 511 to the terminal 513 and does not connect the terminal 511 to the terminal 512. Furthermore, the switch 52 does not connect the terminal 521 to the terminal 523 and connects the terminal 524 to the terminal 523.

As a result, the SRS of band A is transmitted from the RFIC 3 to the antenna 2*a* via the RF input terminal 111, the PA 11, the filter 63, the switch 52, the switch 51, and the antenna connection terminal 101.

Figure 6:
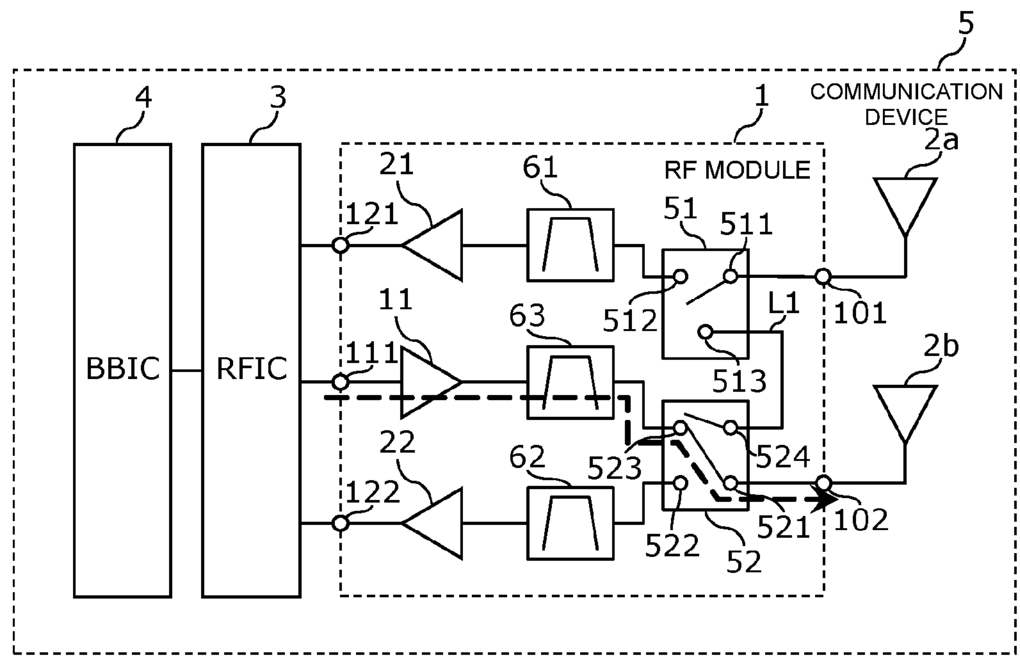
FIG. 6 is a circuit configuration diagram illustrating a third connection state of the RF module according to the first exemplary embodiment.

A description is now given of a third connection state for transmitting an SRS of band A via the antenna 2*b*, and a signal flow in the third connection state, with reference to FIG. 6. FIG. 6 is a circuit configuration diagram illustrating the third connection state of the RF module 1 according to the first exemplary embodiment.

The RFIC 3 is capable of implementing the third connection state in FIG. 6 by controlling the individual switches of the RF module 1. In the third connection state, the switch 51 may connect, but need not connect, the terminal 511 to the terminal 512 or the terminal 513. The switch 52 connects the terminal 521 to the terminal 523 and does not connect the terminal 524 to the terminal 523.

As a result, the SRS of band A is transmitted from the RFIC 3 to the antenna 2*b* via the RF input terminal 111, the PA 11, the filter 63, the switch 52, and the antenna connection terminal 102.

In this way, the communication device 5 is capable of simultaneously receiving two downlink signals by the two antennas 2*a* and 2*b* in the first connection state, and is capable of individually transmitting SRSs from the antennas 2*a* and 2*b* in the second connection state and the third connection state.

1.4. Advantageous Effects and the Like

As described above, the RF module 1 according to the exemplary embodiment includes the filter 61 having a pass band including band A for TDD; the filter 62 having a pass band including band A; the low-noise amplifier 21 connected to one end of the filter 61; the low-noise amplifier 22 connected to one end of the filter 62; the switch 51 including the terminal 511 connected to the antenna connection terminal 101, the terminal 512 connected to the other end of the filter 61, and the terminal 513 connected to the RF input terminal 111 for receiving an uplink signal of band A from the outside; and the switch 52 including the terminal 521 connected to the antenna connection terminal 102, the terminal 522 connected to the other end of the filter 62, and the terminal 523 connected to the RF input terminal 111. The switch 51 is formed in the die D1, and the switch 52 is formed in the die D2 different from the die D1.

Accordingly, the switch 51 capable of connecting the filter 61 to the antenna connection terminal 101 and the switch 52 capable of connecting the filter 62 to the antenna connection terminal 102 can be formed in the dies D1 and D2 different from each other, respectively. This makes it possible to improve the isolation between the path of a downlink signal from the antenna 2*a* and the path of a downlink signal from the antenna 2*b*. As a result, for reception of downlink signals of band A by MIMO, it is possible to reduce the interference between the downlink signal input from the antenna 2*a* via the antenna connection terminal 101 and the downlink signal input from the antenna 2*b* via the antenna connection terminal 102. That is, the RF module 1 is capable of improving reception sensitivity in MIMO wireless communication.

A required value for the isolation between reception paths tends to increase. An estimated reason for this is that a required value for error vector magnitude (EVM) has been increasing due to higher-order modulation (for example, adoption of 256 quadrature amplitude modulation (QAM) or the like). While the required value for the isolation between reception paths tends to increase, the RF module 1 according to the present embodiment is capable of exhibiting an advantageous effect of improving the isolation between two reception paths as compared with an existing RF module. For example, in FIG. 1D of Japanese Unexamined Patent Application Publication No. 2019-176452, the isolation between two reception paths leading to low-noise amplifiers 60*b* and 60*c* is secured by the isolation between the ports of DPDT 31. On the other hand, in the exemplary embodiment, the isolation between two reception paths is secured by the isolation between the terminals 511 and 513 of the switch 51, the isolation between the terminals 524 and 523 of the switch 52, and the isolation between the terminals 521 and 523 of the switch 52. Thus, the RF module 1 according to the exemplary embodiment is capable of improving the isolation between two reception paths as compared with the RF module according to Japanese Unexamined Patent Application Publication No. 2019-176452.

For example, in the RF module 1 according to the exemplary embodiment, the switch 52 may include the terminal 524 connected to the terminal 513 of the switch 51 via the wiring line L1 disposed outside the die D1 and outside the die D2, and the terminal 513 of the switch 51 may be connected to the RF input terminal 111 via the switch 52.

Accordingly, the switches 51 and 52 can be connected to each other via the wiring line L1 disposed outside the die D1 and outside the die D2. Thus, the distances from the terminals 511 and 512 included in the reception path leading to the antenna 2*a* to the terminals 521 and 522 included in the reception path leading to the antenna 2*b* can be secured, the coupling between the terminals 511 and 512 and the terminals 521 and 522 can be easily suppressed, and the reception sensitivity can be further improved.

For example, in the RF module 1 according to the exemplary embodiment, for reception of downlink signals of band A by MIMO via both the antenna connection terminals 101 and 102, the switch 51 may connect the terminal 511 to the terminal 512 and need not connect the terminal 511 to the terminal 513, and the switch 52 may connect the terminal 521 to the terminal 522 and need not connect the terminal 521 to the terminal 523; for transmission of an uplink signal of band A via the antenna connection terminal 101, the switch 51 may connect the terminal 511 to the terminal 513 and need not connect the terminal 511 to the terminal 512, and the switch 52 need not connect the terminal 521 to the terminal 523 and may connect the terminal 524 to the terminal 523; and for transmission of an uplink signal of band A via the antenna connection terminal 102, the switch 52 may connect the terminal 521 to the terminal 523, need not connect the terminal 521 to the terminal 522, and need not connect the terminal 524 to the terminal 523.

Accordingly, when the switch 51 does not connect the terminal 511 to the terminal 513 and the switch 52 does not connect the terminal 521 to the terminal 523 for reception of downlink signals of band A by MIMO, the interference between two downlink signals can be reduced, and the reception sensitivity can be improved. Furthermore, when the switch 51 connects the terminal 511 to the terminal 513 or the switch 52 connects the terminal 521 to the terminal 523, uplink signals of band A can be individually transmitted from the antennas 2*a* and 2*b*.

For example, in the RF module 1 according to the exemplary embodiment, band A may be a frequency band for 5G NR, and the uplink signal may be a sounding reference signal.

Accordingly, sounding reference signals used in 5G NR can be individually transmitted from the antennas 2*a* and 2*b* via the antenna connection terminals 101 and 102. This makes it possible for a base station to estimate how an RF signal propagates from the base station to a terminal as a result of being affected by multipath propagation and distance attenuation, and makes it possible to implement appropriate radio link control.

For example, in the RF module 1 according to the present embodiment, at least one of the terminal 513 of the switch 51 or the terminal 523 of the switch 52 may be disposed between the terminal 512 of the switch 51 and the terminal 522 of the switch 52 in plan view.

Accordingly, the terminal 513 and/or the terminal 523 can be disposed between the terminal 512 included in the reception path leading to the antenna 2*a* and the terminal 522 included in the reception path leading to the antenna 2*b*. Thus, the isolation between the two reception paths can be improved, and the reception sensitivity can be improved.

For example, the RF module 1 according to the present embodiment may further include the filter 63 connected to the RF input terminal 111 and having a pass band including band A. The terminal 513 of the switch 51 and the terminal 523 of the switch 52 may be connected to the RF input terminal 111 via the filter 63.

Accordingly, signals of band A among RF signals input to the RF input terminal 111 can be passed and transmitted to the antenna connection terminals 101 and 102.

For example, the RF module 1 according to the exemplary embodiment may further include the PA 11 connected between the filter 63 and the RF input terminal 111.

Accordingly, an RF signal input to the RF input terminal 111 can be amplified.

For example, in the RF module 1 according to the exemplary embodiment, band A may be n41, n77, n78, or n79 for 5G NR.

Accordingly, n41, n77, n78, or n79 for 5G NR can be used as band A for TDD.

In addition, the communication device 5 according to the exemplary embodiment includes the RFIC 3 configured to process an RF signal, and the RF module 1 configured to transmit the RF signal between a plurality of antennas and the RFIC 3.

Accordingly, the communication device 5 is capable of achieving effects similar to those of the RF module 1.

Second Exemplary Embodiment

Next, a second exemplary embodiment will be described. Differences between the second exemplary embodiment and above-described first exemplary embodiment include that each switch includes a ground terminal. Hereinafter, the second exemplary embodiment will be described with a focus on differences from the first exemplary embodiment with reference to the drawings.

2.1. Circuit Configurations of RF Module 1A and Communication Device 5A

Figure 7:
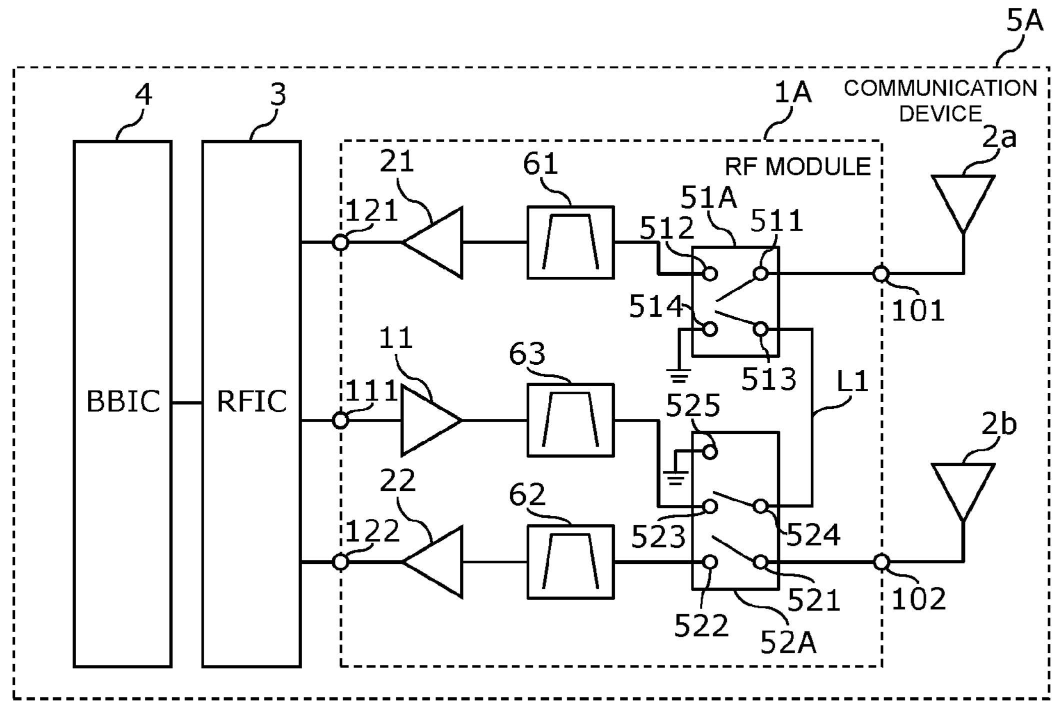
FIG. 7 is a circuit configuration diagram of an RF module and a communication device according to a second exemplary embodiment.

A communication device 5A according to the exemplary embodiment is a mobile terminal that supports 2×2 downlink MIMO, as in the first exemplary embodiment. The circuit configuration of the communication device 5A will be described with reference to FIG. 7. FIG. 7 is a circuit configuration diagram of an RF module 1A and the communication device 5A according to the second exemplary embodiment. The communication device 5A is the same as the communication device 5 according to the first exemplary embodiment except that the communication device 5A includes the RF module 1A instead of the RF module 1. Thus, a description will be given below mainly of the circuit configuration of the RF module 1A.

The RF module 1A according to the exemplary embodiment includes a PA 11, low-noise amplifiers 21 and 22, switches 51A and 52A, filters 61 to 63, antenna connection terminals 101 and 102, an RF input terminal 111, and RF output terminals 121 and 122.

The switch 51A is an example of a first switch, and includes terminals 511 to 514. The terminal 511 is an example of a first terminal, and is connected to the antenna connection terminal 101. The terminal 512 is an example of a second terminal, and is connected to the filter 61. The terminal 513 is an example of a third terminal, and is connected to the filter 63 via the switch 52A. The terminal 514 is an example of a first ground terminal, and is connected to ground.

With this connection configuration, the switch 51A is capable of connecting the terminal 511 to either the terminal 512 or the terminal 513 in response to, for example, a control signal from the RFIC 3. That is, the switch 51A is capable of switching the connection destination of the antenna 2*a* between the filters 61 and 63. Furthermore, the switch 51A is capable of connecting the terminal 513 to the terminal 514.

The switch 52A is an example of a second switch, and includes terminals 521 to 525. The terminal 521 is an example of a fourth terminal, and is connected to the antenna connection terminal 102. The terminal 522 is an example of a fifth terminal, and is connected to the filter 62. The terminal 523 is an example of a sixth terminal, and is connected to the filter 63. The terminal 524 is an example of a seventh terminal, and is connected to the terminal 513 of the switch 51A via a wiring line L1. The terminal 525 is an example of a second ground terminal, and is connected to ground.

With this connection configuration, the switch 52A is capable of connecting the terminal 521 to either the terminal 522 or the terminal 523 in response to, for example, a control signal from the RFIC 3. That is, the switch 52A is capable of switching the connection destination of the antenna 2*b* between the filters 62 and 63. Furthermore, the switch 52A is capable of connecting the terminal 524 to either the terminal 523 or the terminal 525.

2.2. Arrangement of Components of RF Module 1A

The arrangement of the components of the RF module 1A according to the exemplary embodiment is similar to that of the RF module 1 according to the first exemplary embodiment, and thus the illustration thereof is omitted. Also in the exemplary embodiment, the switches 51A and 52A are formed in different dies D1 and D2, respectively. The switch 52A is connected to the switch 51A via the wiring line L1 disposed outside the die D1 and outside the die D2.

2.3. Connection States of RF Module 1A

Figure 8:
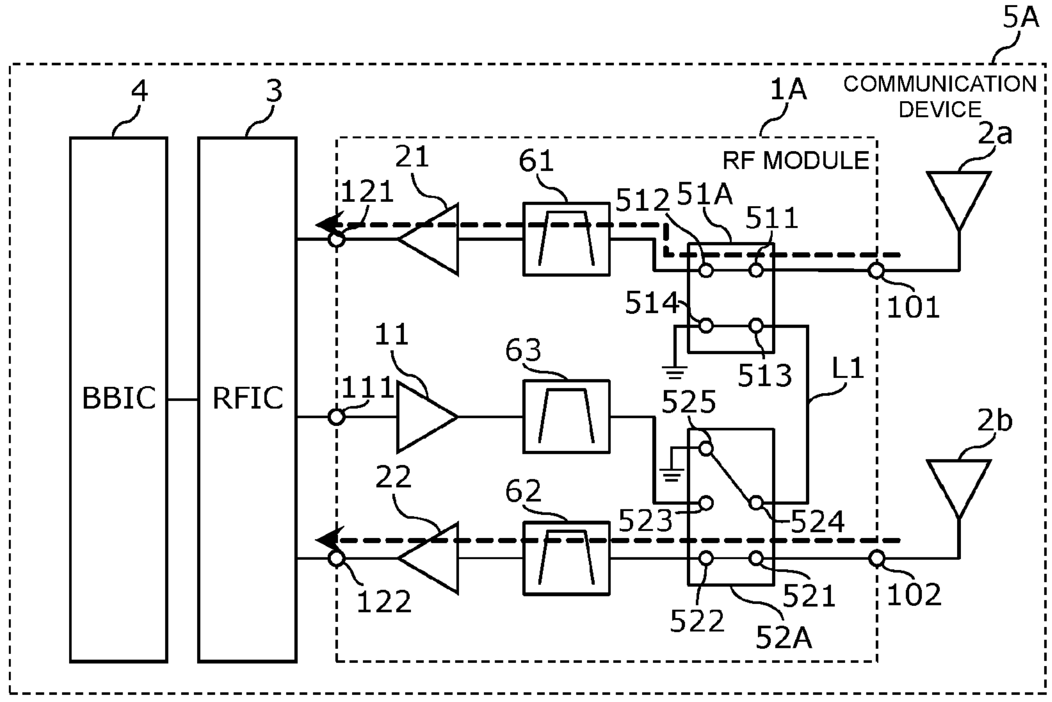
FIG. 8 is a circuit configuration diagram illustrating a first connection state of the RF module according to the second exemplary embodiment.

Next, a description will be given of a plurality of connection states of the RF module 1A having the above-described configuration, and signal flows in the individual connection states. Second and third connection states for transmitting an SRS are similar to those in the first exemplary embodiment, and thus the illustration and description thereof are omitted. A first connection state for receiving downlink signals of band A by MIMO will be described with reference to FIG. 8. FIG. 8 is a circuit configuration diagram illustrating the first connection state of the RF module 1A according to the second exemplary embodiment.

The RFIC 3 is capable of implementing the first connection state in FIG. 8 by controlling the individual switches of the RF module 1A. In the first connection state, the switch 51A connects the terminal 511 to the terminal 512, does not connect the terminal 511 to the terminal 513, and connects the terminal 513 to the terminal 514. Furthermore, the switch 52A connects the terminal 521 to the terminal 522, does not connect the terminal 521 to the terminal 523, and connects the terminal 524 to the terminal 525.

As a result, a downlink signal of band A is transmitted from the antenna 2*a* to the RFIC 3 via the antenna connection terminal 101, the switch 51A, the filter 61, the low-noise amplifier 21, and the RF output terminal 121. Furthermore, a downlink signal of band A is transmitted from the antenna 2*b* to the RFIC 3 via the antenna connection terminal 102, the switch 52A, the filter 62, the low-noise amplifier 22, and the RF output terminal 122. The terminals 513 and 524 and the wiring line L1 are also set to a ground potential.

2.4. Advantageous Effects and the Like

As described above, the RF module 1A according to the exemplary embodiment includes the filter 61 having a pass band including band A for TDD; the filter 62 having a pass band including band A; the low-noise amplifier 21 connected to one end of the filter 61; the low-noise amplifier 22 connected to one end of the filter 62; the switch 51A including the terminal 511 connected to the antenna connection terminal 101, the terminal 512 connected to the other end of the filter 61, and the terminal 513 connected to the RF input terminal 111 for receiving an uplink signal of band A from the outside; and the switch 52A including the terminal 521 connected to the antenna connection terminal 102, the terminal 522 connected to the other end of the filter 62, and the terminal 523 connected to the RF input terminal 111. The switch 51A is formed in the die D1, and the switch 52A is formed in the die D2 different from the die D1.

Accordingly, like the RF module 1 according to the second exemplary embodiment, the RF module 1A is capable of improving reception sensitivity in MIMO wireless communication.

For example, in the RF module 1A according to the exemplary embodiment, the switch 51A may include the terminal 514 connected to ground, and the switch 52A may include the terminal 525 connected to ground.

Accordingly, the switches 51A and 52A are capable of including the terminals 514 and 525 connected to ground, respectively, and the isolation between terminals can be improved in each of the switches 51A and 52A.

For example, in the RF module 1A according to the exemplary embodiment, for reception of downlink signals of band A by MIMO via both the antenna connection terminals 101 and 102, the switch 51A may connect the terminal 511 to the terminal 512, need not connect the terminal 511 to the terminal 513, and may connect the terminal 513 to the terminal 514, and the switch 52A may connect the terminal 521 to the terminal 522, need not connect the terminal 521 to the terminal 523, and may connect the terminal 524 to the terminal 525; for transmission of an uplink signal of band A via the antenna connection terminal 101, the switch 51A may connect the terminal 511 to the terminal 513 and need not connect the terminal 511 to the terminal 512, and the switch 52A need not connect the terminal 521 to the terminal 523 and may connect the terminal 524 to the terminal 523; and for transmission of an uplink signal of band A via the antenna connection terminal 102, the switch 52A may connect the terminal 521 to the terminal 523, need not connect the terminal 521 to the terminal 522, and need not connect the terminal 524 to the terminal 523.

Accordingly, for reception of downlink signals of band A by MIMO, the terminal 513 of the switch 51A can be connected to the terminal 514 set to a ground potential, and the terminal 524 of the switch 52A can be connected to the terminal 525 set to a ground potential. Thus, the isolation between the two reception paths can be further improved, and the reception sensitivity can be improved. Furthermore, when the switch 51A connects the terminal 511 to the terminal 513 or the switch 52A connects the terminal 521 to the terminal 523, uplink signals of band A can be individually transmitted from the antennas 2*a* and 2*b*.

For example, in the RF module 1A according to the exemplary embodiment, band A may be a frequency band for 5G NR, and the uplink signal may be a sounding reference signal.

Accordingly, sounding reference signals used in 5G NR can be individually transmitted from the antennas 2*a* and 2*b* via the antenna connection terminals 101 and 102. This makes it possible for a base station to estimate how an RF signal propagates from the base station to a terminal as a result of being affected by multipath propagation and distance attenuation, and makes it possible to implement appropriate radio link control.

Third Exemplary Embodiment

Next, a third exemplary embodiment will be described. Differences between the third exemplary embodiment and the first and second exemplary embodiments include that a transmission path connecting the RF input terminal 111 and the antenna connection terminal 101 can be brought into conduction without passing through the switch connected to the antenna connection terminal 102. Hereinafter, the third exemplary embodiment will be described with a focus on differences from the above-described first and second exemplary embodiments with reference to the drawings.

3.1. Circuit Configurations of RF Module 1B and Communication Device 5B

Figure 9:
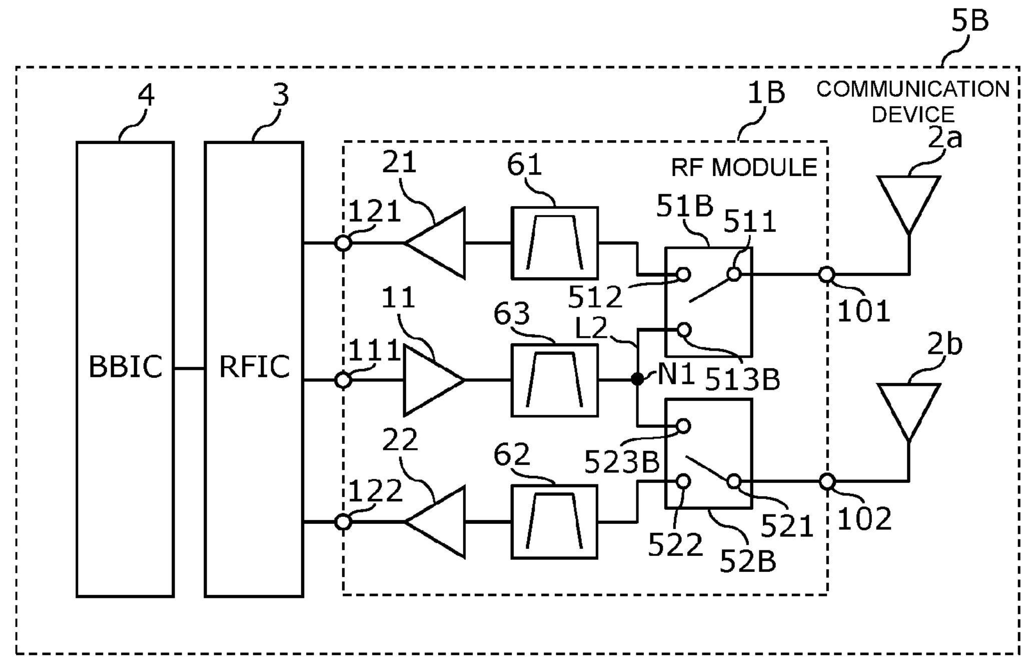
FIG. 9 is a circuit configuration diagram of an RF module and a communication device according to a third exemplary embodiment.

A communication device 5B according to the exemplary embodiment is a mobile terminal that supports 2×2 downlink MIMO, as in the first exemplary embodiment. The circuit configuration of the communication device 5B will be described with reference to FIG. 9. FIG. 9 is a circuit configuration diagram of an RF module 1B and the communication device 5B according to the third exemplary embodiment. The communication device 5B is the same as the communication device 5 according to the first exemplary embodiment except that the communication device 5B includes the RF module 1B instead of the RF module 1. Thus, a description will be given below mainly of the circuit configuration of the RF module 1B.

The RF module 1B according to the exemplary embodiment includes a PA 11, low-noise amplifiers 21 and 22, switches 51B and 52B, filters 61 to 63, antenna connection terminals 101 and 102, an RF input terminal 111, and RF output terminals 121 and 122.

The switch 51B is an example of a first switch, and includes terminals 511, 512, and 513B. The terminal 513B is an example of a third terminal, and is connected to the filter 63 without passing through the switch 52B. Specifically, the terminal 513B is connected to the filter 63 without passing through the switch 52B. More specifically, the terminal 513B is connected to the filter 63 via a node N1 on a path connecting the filter 63 and a terminal 523B of the switch 52B. The node N1 is located at a branch point between a path connecting the filter 63 and the switch 51B and a path connecting the filter 63 and the switch 52B.

With this connection configuration, the switch 51B is capable of connecting the terminal 511 to either the terminal 512 or the terminal 513B in response to, for example, a control signal from the RFIC 3. That is, the switch 51B is capable of switching the connection destination of the antenna 2*a* between the filters 61 and 63. The switch 51B includes, for example, an SPDT switch circuit.

The switch 52B is an example of a second switch, and includes terminals 521, 522, and 523B. The terminal 523B is an example of a sixth terminal, and is connected to the filter 63. Specifically, the terminal 523B is connected to the filter 63 via the node N1 on a path connecting the filter 63 and the terminal 513B of the switch 51B.

With this connection configuration, the switch 52B is capable of connecting the terminal 521 to either the terminal 522 or the terminal 523B in response to, for example, a control signal from the RFIC 3. That is, the switch 52B is capable of switching the connection destination of the antenna 2*b* between the filters 62 and 63. The switch 52B includes, for example, an SPDT switch circuit.

3.2. Arrangement of Components of RF Module 1B

The arrangement of the components of the RF module 1B according to the exemplary embodiment is similar to that of the RF module 1 according to the first exemplary embodiment, and thus the illustration thereof is omitted. Also in the exemplary embodiment, the switches 51B and 52B are formed in different dies D1 and D2, respectively. The switch 52B is connected to the switch 51B via a wiring line L2 disposed outside the die D1 and outside the die D2.

3.3. Connection States of RF Module 1B

Figure 10:
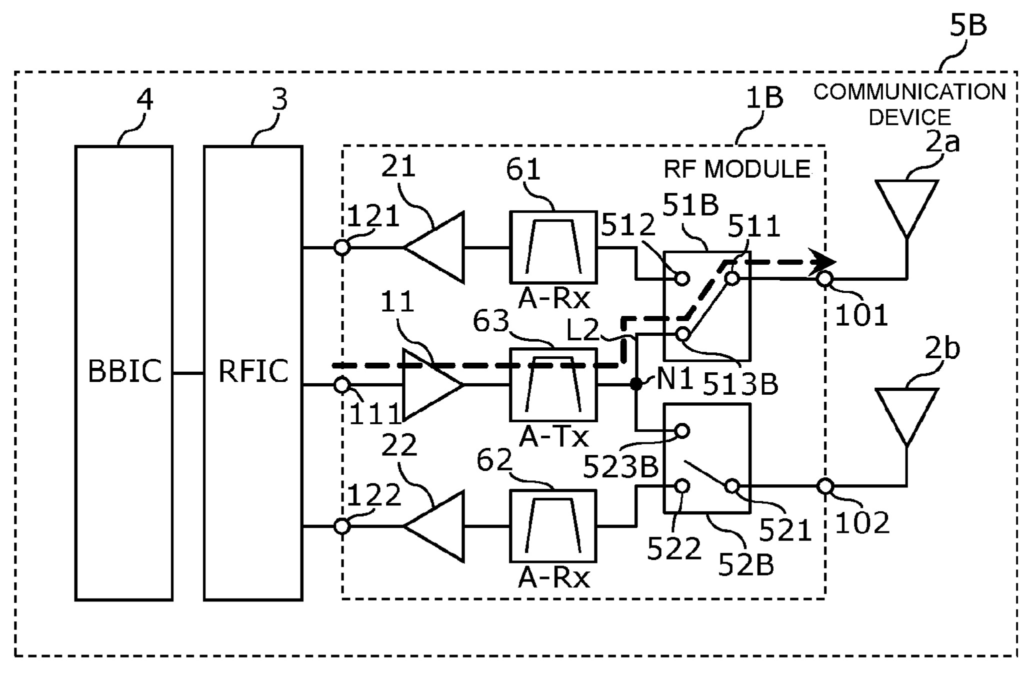
FIG. 10 is a circuit configuration diagram illustrating a second connection state of the RF module according to the third exemplary embodiment.

Next, a description will be given of a plurality of connection states of the RF module 1B having the above-described configuration, and signal flows in the individual connection states. First and third connection states are similar to those in the first exemplary embodiment, and thus the illustration and description thereof are omitted. A second connection state for transmitting an SRS of band A via the antenna 2*a* will be described with reference to FIG. 10. FIG. 10 is a circuit configuration diagram illustrating the second connection state of the RF module 1B according to the third exemplary embodiment.

The RFIC 3 is capable of implementing the second connection state in FIG. 10 by controlling the individual switches of the RF module 1B. In the second connection state, the switch 51B connects the terminal 511 to the terminal 513B and does not connect the terminal 511 to the terminal 512.

As a result, the SRS of band A is transmitted from the RFIC 3 to the antenna 2*a* via the RF input terminal 111, the PA 11, the filter 63, the switch 51B, and the antenna connection terminal 101.

3.4. Advantageous Effects and the Like

As described above, the RF module 1B according to the exemplary embodiment includes the filter 61 having a pass band including band A for TDD; the filter 62 having a pass band including band A; the low-noise amplifier 21 connected to one end of the filter 61; the low-noise amplifier 22 connected to one end of the filter 62; the switch 51B including the terminal 511 connected to the antenna connection terminal 101, the terminal 512 connected to the other end of the filter 61, and the terminal 513B connected to the RF input terminal 111 for receiving an uplink signal of band A from the outside; and the switch 52B including the terminal 521 connected to the antenna connection terminal 102, the terminal 522 connected to the other end of the filter 62, and the terminal 523B connected to the RF input terminal 111. The switch 51B is formed in the die D1, and the switch 52B is formed in the die D2 different from the die D1.

Accordingly, like the RF module 1 according to the first exemplary embodiment, the RF module 1B is capable of improving reception sensitivity in MIMO wireless communication.

For example, in the RF module 1B according to the exemplary embodiment, the terminal 513B of the switch 51B may be connected to the RF input terminal 111 without passing through the switch 52B.

Accordingly, the terminal 513B of the switch 51B can be connected to the RF input terminal 111 without passing through the switch 52B. Thus, the configuration of the switch 52B can be simplified. In addition, the wiring length of the path connecting the antenna connection terminal 101 and the RF input terminal 111 can be shortened.

For example, in the RF module 1B according to the exemplary embodiment, for reception of downlink signals of band A by MIMO via both the antenna connection terminals 101 and 102, the switch 51B may connect the terminal 511 to the terminal 512 and need not connect the terminal 511 to the terminal 513B, and the switch 52B may connect the terminal 521 to the terminal 522 and need not connect the terminal 521 to the terminal 523B; for transmission of an uplink signal of band A via the antenna connection terminal 101, the switch 51B may connect the terminal 511 to the terminal 513B and need not connect the terminal 511 to the terminal 512, and the switch 52B need not connect the terminal 521 to the terminal 523B; and for transmission of an uplink signal of band A via the antenna connection terminal 102, the switch 52B may connect the terminal 521 to the terminal 523B and need not connect the terminal 521 to the terminal 522.

Accordingly, when the switch 51B does not connect the terminal 511 to the terminal 513B and the switch 52B does not connect the terminal 521 to the terminal 523B for reception of downlink signals of band A by MIMO, the interference between two downlink signals can be reduced, and the reception sensitivity can be improved. Furthermore, when the switch 51B connects the terminal 511 to the terminal 513B or the switch 52B connects the terminal 521 to the terminal 523B, uplink signals of band A can be individually transmitted from the antennas 2*a* and 2*b*.

For example, in the RF module 1B according to the exemplary embodiment, band A may be a frequency band for 5G NR, and the uplink signal may be a sounding reference signal.

Accordingly, sounding reference signals used in 5G NR can be individually transmitted from the antennas 2*a* and 2*b* via the antenna connection terminals 101 and 102. This makes it possible for a base station to estimate how an RF signal propagates from the base station to a terminal as a result of being affected by multipath propagation and distance attenuation, and makes it possible to implement appropriate radio link control.

Fourth Exemplary Embodiment

Next, a fourth exemplary embodiment will be described. Differences between the fourth exemplary embodiment and the above-described exemplary embodiments include the configuration of switches. Hereinafter, the fourth exemplary embodiment will be described with a focus on differences from the above-described exemplary embodiments with reference to the drawings.

4.1. Circuit Configurations of RF Module 1C and Communication Device 5C

Figure 11:
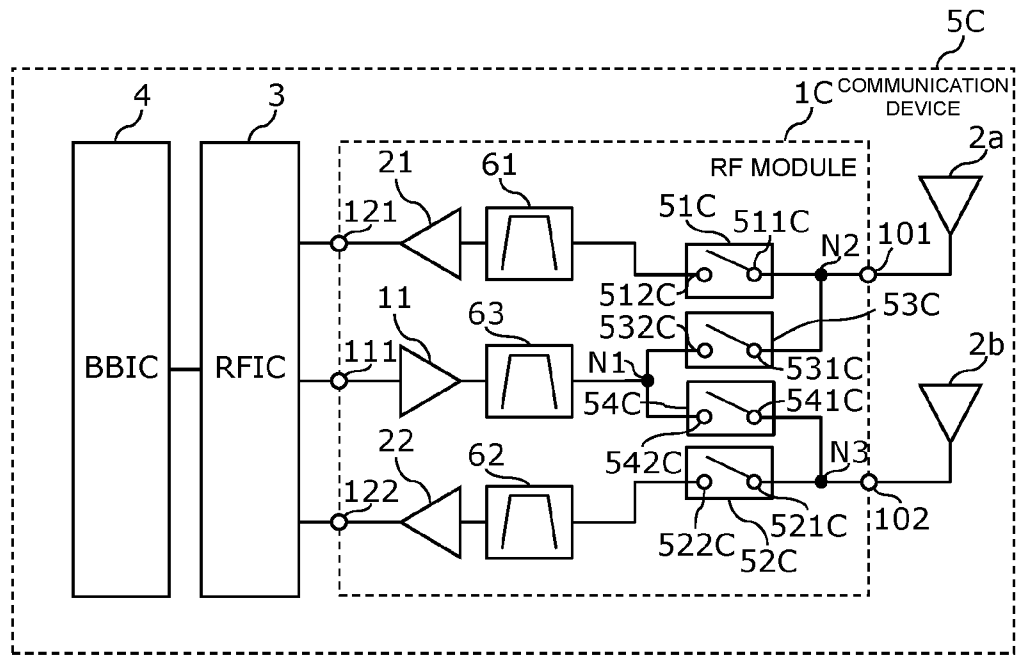
FIG. 11 is a circuit configuration diagram of an RF module and a communication device according to a fourth exemplary embodiment.

A communication device 5C according to the exemplary embodiment is a mobile terminal that supports 2×2 downlink MIMO, as in the first exemplary embodiment. The circuit configuration of the communication device 5C will be described with reference to FIG. 11. FIG. 11 is a circuit configuration diagram of an RF module 1C and the communication device 5C according to the fourth exemplary embodiment. The communication device 5C is the same as the communication device 5 according to the first exemplary embodiment except that the communication device 5C includes the RF module 1C instead of the RF module 1. Thus, a description will be given below mainly of the circuit configuration of the RF module 1C.

The RF module 1C according to the exemplary embodiment includes a PA 11, low-noise amplifiers 21 and 22, switches 51C to 54C, filters 61 to 63, antenna connection terminals 101 and 102, an RF input terminal 111, and RF output terminals 121 and 122.

The switch 51C is an example of a first switch, and includes terminals 511C and 512C. The terminal 511C is connected to the antenna connection terminal 101. Specifically, the terminal 511C is connected to the antenna connection terminal 101 via a node N2 on a path connecting the antenna connection terminal 101 and a terminal 531C of the switch 53C. The node N2 is located at a branch point between a path connecting the antenna connection terminal 101 and the switch 51C and a path connecting the antenna connection terminal 101 and the switch 53C. The terminal 512C is connected to the filter 61.

With this connection configuration, the switch 51C is capable of connecting the terminal 511C to the terminal 512C in response to, for example, a control signal from the RFIC 3. That is, the switch 51C is capable of switching between connection and disconnection between the antenna connection terminal 101 and the filter 61. The switch 51C includes, for example, a single-pole single-throw (SPST) switch circuit.

The switch 52C is an example of a second switch, and includes terminals 521C and 522C. The terminal 521C is connected to the antenna connection terminal 102. Specifically, the terminal 521C is connected to the antenna connection terminal 102 via a node N3 on a path connecting the antenna connection terminal 102 and a terminal 541C of the switch 54C. The node N3 is located at a branch point between a path connecting the antenna connection terminal 102 and the switch 52C and a path connecting the antenna connection terminal 102 and the switch 54C. The terminal 522C is connected to the filter 62.

With this connection configuration, the switch 52C is capable of connecting the terminal 521C to the terminal 522C in response to, for example, a control signal from the RFIC 3. That is, the switch 52C is capable of switching between connection and disconnection between the antenna connection terminal 102 and the filter 62. The switch 52C includes, for example, an SPST switch circuit.

The switch 53C is an example of a third switch, and includes terminals 531C and 532C. The terminal 531C is connected to the antenna connection terminal 101. Specifically, the terminal 531C is connected to the antenna connection terminal 101 via the node N2. The terminal 532C is connected to the filter 63. Specifically, the terminal 532C is connected to the filter 63 via a node N1 on a path connecting the filter 63 and a terminal 542C of the switch 54C. The node N1 is located at a branch point between a path connecting the filter 63 and the switch 53C and a path connecting the filter 63 and the switch 54C.

With this connection configuration, the switch 53C is capable of connecting the terminal 531C to the terminal 532C in response to, for example, a control signal from the RFIC 3. That is, the switch 53C is capable of switching between connection and disconnection between the antenna connection terminal 101 and the filter 63. In other words, the switch 53C is capable of switching between connection and disconnection between the antenna connection terminal 101 and the RF input terminal 111. The switch 53C includes, for example, an SPST switch circuit.

The switch 54C is an example of a fourth switch, and includes terminals 541C and 542C. The terminal 541C is connected to the antenna connection terminal 102. Specifically, the terminal 541C is connected to the antenna connection terminal 102 via the node N3. The terminal 542C is connected to the filter 63. Specifically, the terminal 542C is connected to the filter 63 via the node N1.

With this connection configuration, the switch 54C is capable of connecting the terminal 541C to the terminal 542C in response to, for example, a control signal from the RFIC 3. That is, the switch 54C is capable of switching between connection and disconnection between the antenna connection terminal 102 and the filter 63. In other words, the switch 54C is capable of switching between connection and disconnection between the antenna connection terminal 102 and the RF input terminal 111. The switch 54C includes, for example, an SPST switch circuit.

In the above-described configuration, the switches 53C and 54C are connected in series to each other between the antenna connection terminals 101 and 102. That is, the antenna connection terminals 101 and 102 are connected to each other via the switches 53C and 54C. Thus, unless both the switches 53C and 54C are turned ON, the antenna connection terminals 101 and 102 are not connected to each other.

4.2. Arrangement of Components of RF Module 1C

The arrangement of the components of the RF module 1C according to the exemplary embodiment is similar to that of the RF module 1 according to the first exemplary embodiment, and thus the illustration thereof is omitted.

In the exemplary embodiment, the switches 51C to 54C are described functionally rather than with respect to physical components. Thus, a method for mounting the switches 51C to 54C need not particularly be limited. That is, the switches 51C to 54C may be individually formed in four dies, or may be formed in one or more dies in any combination. For example, all of the switches 51C to 54C may be formed in one die.

Alternatively, for example, the switches 51C and 52C may be formed in a first die, and the switches 53C and 54C may be formed in a second die different from the first die. In this case, a plurality of terminals included in the same die and connected to each other may be integrated into one terminal. For example, the terminals 511C and 531C may be integrated into one terminal. For example, the terminals 521C and 541C may be integrated into one terminal. When the terminals are integrated in this manner, the switches 51C to 54C are equivalent to the switches 51B and 52B of the third exemplary embodiment. Furthermore, when the terminal 532C is connected to the terminal 542C via a switch instead of the node N1, the switches 51C to 54C are equivalent to the switches 51 and 52 of the first exemplary embodiment.

4.3. Connection States of RF Module 1C

Next, a description will be given of a plurality of connection states of the RF module 1C having the above-described configuration, and signal flows in the individual connection states.

Figure 12:
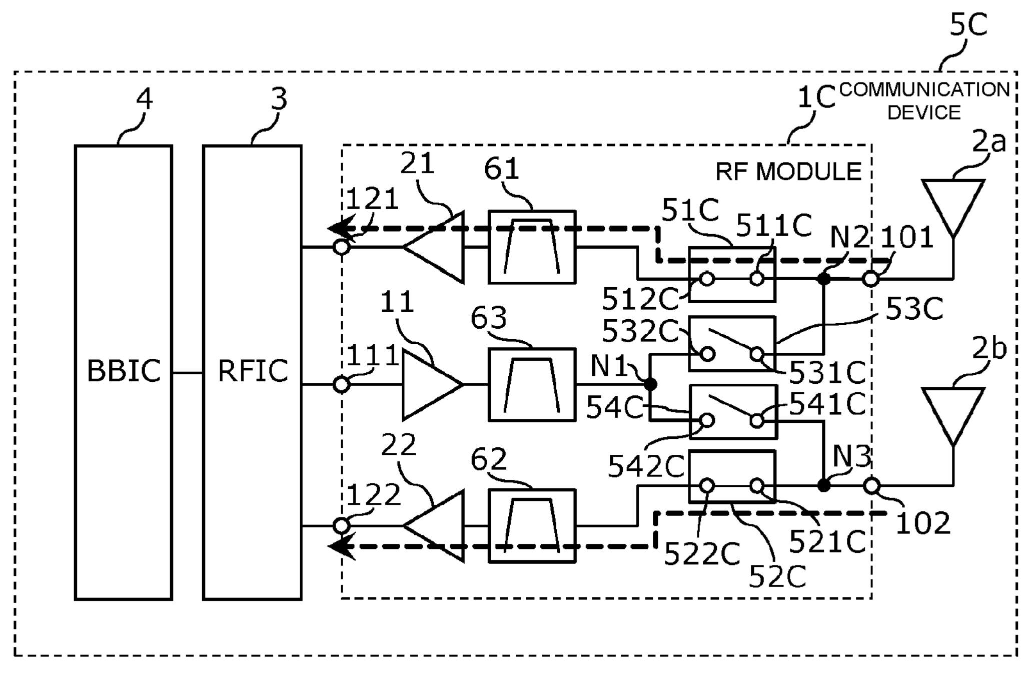
FIG. 12 is a circuit configuration diagram illustrating a first connection state of the RF module according to the fourth exemplary embodiment.

First, a description will be given of a first connection state for receiving downlink signals of band A by MIMO via both the antennas 2*a* and 2*b*, and signal flows in the first connection state, with reference to FIG. 12. FIG. 12 is a circuit configuration diagram illustrating the first connection state of the RF module 1C according to the fourth exemplary embodiment.

The RFIC 3 is capable of implementing the first connection state in FIG. 12 by controlling the individual switches of the RF module 1C. In the first connection state, the switch 51C connects the terminal 511C to the terminal 512C, and the switch 52C connects the terminal 521C to the terminal 522C. On the other hand, the switch 53C does not connect the terminal 531C to the terminal 532C, and the switch 54C does not connect the terminal 541C to the terminal 542C. That is, the two switches 53C and 54C in an OFF state are interposed between the antenna connection terminals 101 and 102.

As a result, a downlink signal of band A is transmitted from the antenna 2*a* to the RFIC 3 via the antenna connection terminal 101, the switch 51C, the filter 61, the low-noise amplifier 21, and the RF output terminal 121. Furthermore, a downlink signal of band A is transmitted from the antenna 2*b* to the RFIC 3 via the antenna connection terminal 102, the switch 52C, the filter 62, the low-noise amplifier 22, and the RF output terminal 122. Thus, the isolation between the paths of the two downlink signals is secured by the two switches 53C and 54C.

Figure 13:
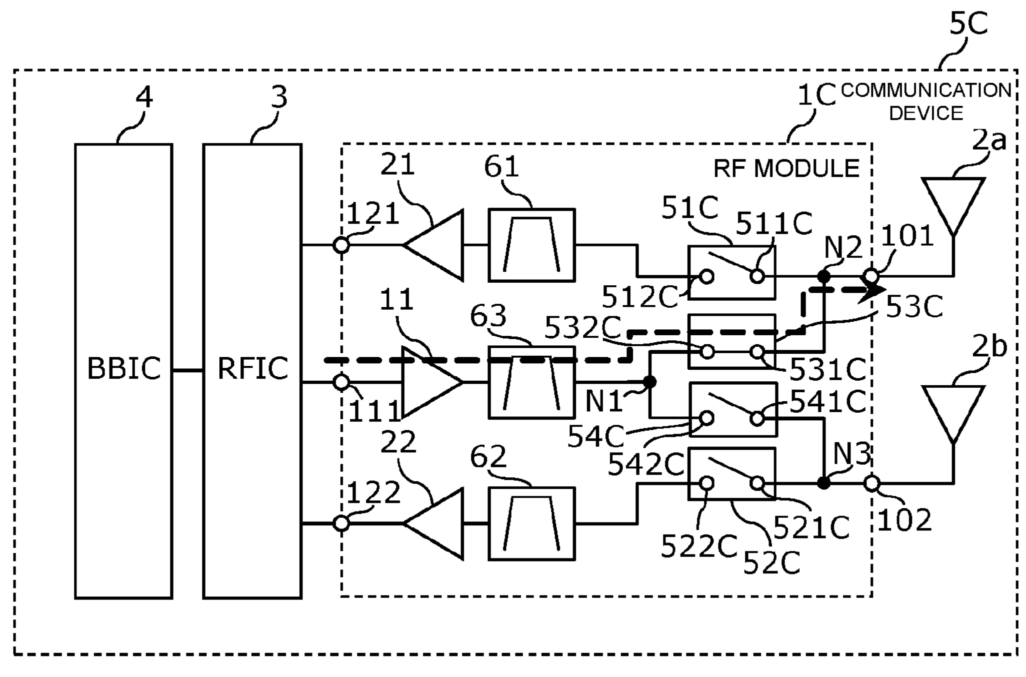
FIG. 13 is a circuit configuration diagram illustrating a second connection state of the RF module according to the fourth exemplary embodiment.

Next, a description will be given of a second connection state for transmitting an SRS of band A via the antenna 2*a*, and a signal flow in the second connection state, with reference to FIG. 13. FIG. 13 is a circuit configuration diagram illustrating the second connection state of the RF module 1C according to the fourth exemplary embodiment.

The RFIC 3 is capable of implementing the second connection state in FIG. 13 by controlling the individual switches of the RF module 1C. In the second connection state, the switch 53C connects the terminal 531C to the terminal 532C, and the switch 54C does not connect the terminal 541C to the terminal 542C.

As a result, the SRS of band A is transmitted from the RFIC 3 to the antenna 2*a* via the RF input terminal 111, the PA 11, the filter 63, the switch 53C, and the antenna connection terminal 101.

Figure 14:
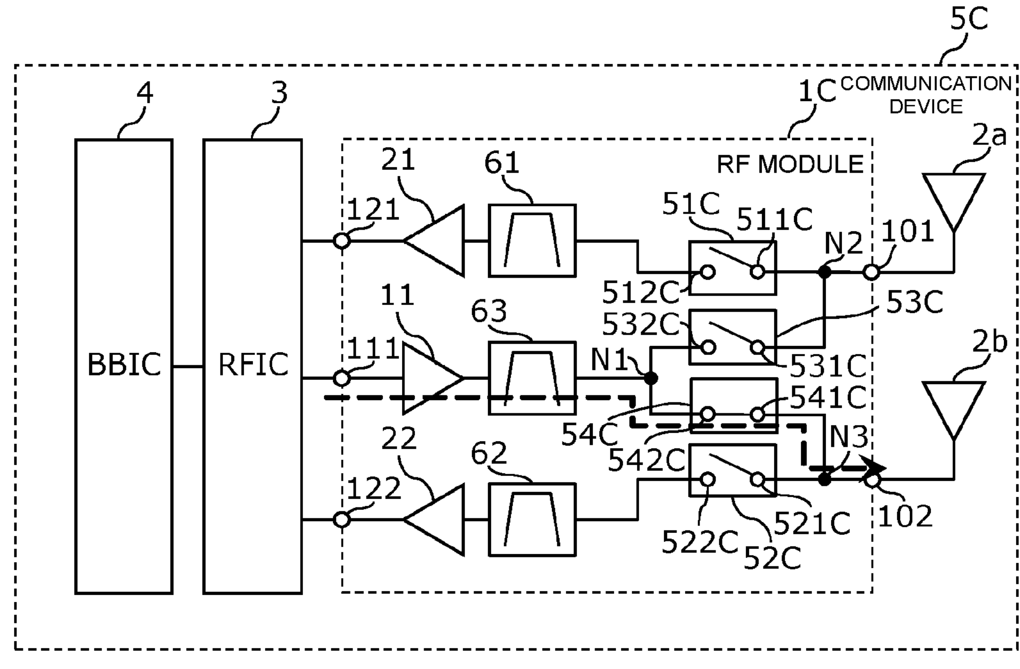
FIG. 14 is a circuit configuration diagram illustrating a third connection state of the RF module according to the fourth exemplary embodiment.

Next, a description will be given of a third connection state for transmitting an SRS of band A via the antenna 2*b*, and a signal flow in the third connection state, with reference to FIG. 14. FIG. 14 is a circuit configuration diagram illustrating the third connection state of the RF module 1C according to the fourth exemplary embodiment.

The RFIC 3 is capable of implementing the third connection state in FIG. 14 by controlling the individual switches of the RF module 1C. In the third connection state, the switch 53C does not connect the terminal 531C to the terminal 532C, and the switch 54C connects the terminal 541C to the terminal 542C.

As a result, the SRS of band A is transmitted from the RFIC 3 to the antenna 2*b* via the RF input terminal 111, the PA 11, the filter 63, the switch 54C, and the antenna connection terminal 102.

4.4. Advantageous Effects and the Like

As described above, the RF module 1C according to the exemplary embodiment includes the filter 61 having a pass band including band A for TDD; the filter 62 having a pass band including band A; the low-noise amplifier 21 connected to one end of the filter 61; the low-noise amplifier 22 connected to one end of the filter 62; the switch 51C capable of switching between connection and disconnection between the antenna connection terminal 101 and the other end of the filter 61; the switch 52C capable of switching between connection and disconnection between the antenna connection terminal 102 and the other end of the filter 62; the switch 53C capable of switching between connection and disconnection between the antenna connection terminal 101 and the RF input terminal 111 for receiving an uplink signal of band A from the outside; and the switch 54C capable of switching between connection and disconnection between the antenna connection terminal 102 and the RF input terminal 111. The antenna connection terminals 101 and 102 are connected to each other via the switches 53C and 54C.

Accordingly, because the antenna connection terminals 101 and 102 are connected to each other via the switches 53C and 54C, the isolation between the path of a downlink signal from the antenna 2*a* and the path of a downlink signal from the antenna 2*b* can be improved by the two switches 53C and 54C. As a result, for reception of downlink signals of band A by MIMO, it is possible to reduce the interference between the downlink signal input from the antenna 2*a* via the antenna connection terminal 101 and the downlink signal input from the antenna 2*b* via the antenna connection terminal 102. That is, the RF module 1C is capable of improving reception sensitivity in MIMO wireless communication.

For example, in the RF module 1C according to the present embodiment, for reception of downlink signals of band A by MIMO via both the antenna connection terminals 101 and 102, the switch 51C may connect the antenna connection terminal 101 to the other end of the filter 61, the switch 52C may connect the antenna connection terminal 102 to the other end of the filter 62, the switch 53C need not connect the antenna connection terminal 101 to the RF input terminal 111, and the switch 54C need not connect the antenna connection terminal 102 to the RF input terminal 111; for transmission of an uplink signal of band A via the antenna connection terminal 101, the switch 51C need not connect the antenna connection terminal 101 to the other end of the filter 61, the switch 52C need not connect the antenna connection terminal 102 to the other end of the filter 62, the switch 53C may connect the antenna connection terminal 101 to the RF input terminal 111, and the switch 54C need not connect the antenna connection terminal 102 to the RF input terminal 111; and for transmission of an uplink signal of band A via the antenna connection terminal 102, the switch 51C need not connect the antenna connection terminal 101 to the other end of the filter 61, the switch 52C need not connect the antenna connection terminal 102 to the other end of the filter 62, the switch 53C need not connect the antenna connection terminal 101 to the RF input terminal 111, and the switch 54C may connect the antenna connection terminal 102 to the RF input terminal 111.

Accordingly, when the switch 53C does not connect the terminal 531C to the terminal 532C and the switch 54C does not connect the terminal 541C to the terminal 542C for reception of downlink signals of band A by MIMO, the interference between two downlink signals can be reduced, and the reception sensitivity can be improved. Furthermore, when the switch 53C connects the terminal 531C to the terminal 532C or the switch 54C connects the terminal 541C to the terminal 542C, uplink signals of band A can be individually transmitted from the antennas 2*a* and 2*b*.

Fifth Exemplary Embodiment

Next, a fifth exemplary embodiment will be described. Differences between the fifth exemplary embodiment and the above-described exemplary embodiments include the configuration of switches. Hereinafter, the fifth exemplary embodiment will be described with a focus on differences from the above-described exemplary embodiments with reference to the drawings.

5.1. Circuit Configurations of RF Module 1D and Communication Device 5D

Figure 15:
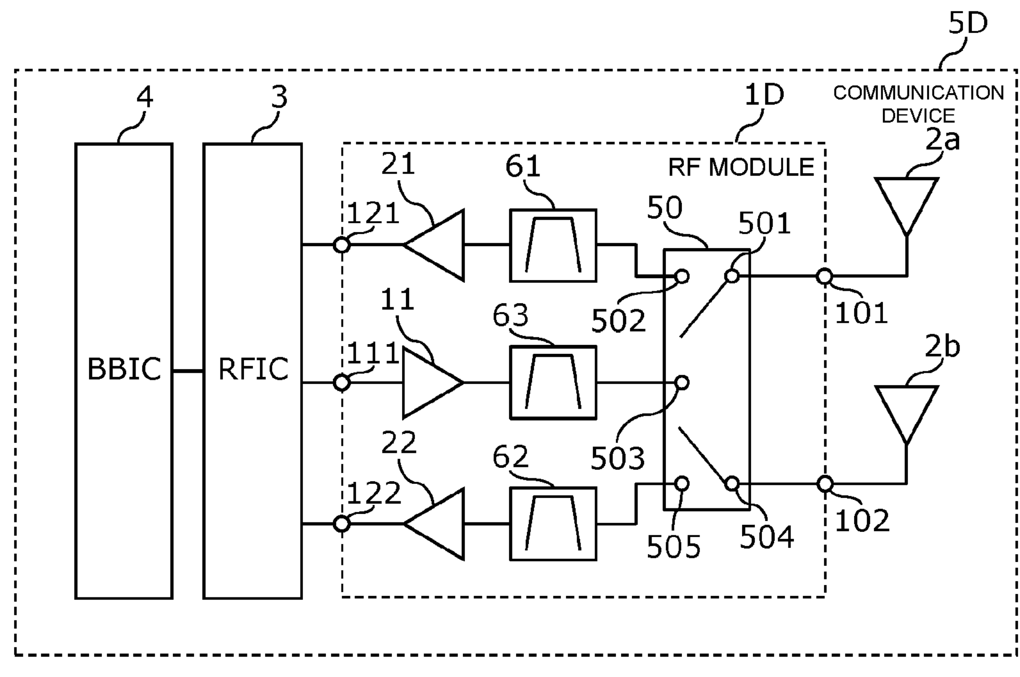
FIG. 15 is a circuit configuration diagram of an RF module and a communication device according to a fifth exemplary embodiment.

A communication device 5D according to the exemplary embodiment is a mobile terminal that supports 2×2 downlink MIMO, as in the first exemplary embodiment. The circuit configuration of the communication device 5D will be described with reference to FIG. 15. FIG. 15 is a circuit configuration diagram of an RF module 1D and the communication device 5D according to the fifth exemplary embodiment. The communication device 5D is the same as the communication device 5 according to the first exemplary embodiment except that the communication device 5D includes the RF module 1D instead of the RF module 1. Thus, a description will be given below mainly of the circuit configuration of the RF module 1D.

The RF module 1D according to the exemplary embodiment includes a PA 11, low-noise amplifiers 21 and 22, a switch circuit 50, filters 61 to 63, antenna connection terminals 101 and 102, an RF input terminal 111, and RF output terminals 121 and 122.

The switch circuit 50 includes terminals 501 to 505. The terminal 501 is an example of a first terminal, and is connected to the antenna connection terminal 101. The terminal 502 is an example of a second terminal, and is connected to the filter 61. The terminal 503 is an example of a third terminal, and is connected to the RF input terminal 111 via the filter 63 and the PA 11. The terminal 504 is an example of a fourth terminal, and is connected to the antenna connection terminal 102. The terminal 505 is an example of a fifth terminal, and is connected to the filter 62.

With this connection configuration, the switch circuit 50 is capable of connecting the terminal 501 to either the terminal 502 or the terminal 503 in response to, for example, a control signal from the RFIC 3. That is, the switch circuit 50 is capable of switching between connection and disconnection between the antenna connection terminal 101 and the filter 61, and is capable of switching between connection and disconnection between the antenna connection terminal 101 and the filter 63. Furthermore, the switch circuit 50 is capable of connecting the terminal 504 to either the terminal 503 or the terminal 505 in response to, for example, a control signal from the RFIC 3. That is, the switch circuit 50 is capable of switching between connection and disconnection between the antenna connection terminal 102 and the filter 62, and is capable of switching between connection and disconnection between the antenna connection terminal 102 and the filter 63. The switch circuit 50 is, for example, a multi-connection switch circuit.

5.2. Circuit Configuration of Switch Circuit 50

Figure 16:
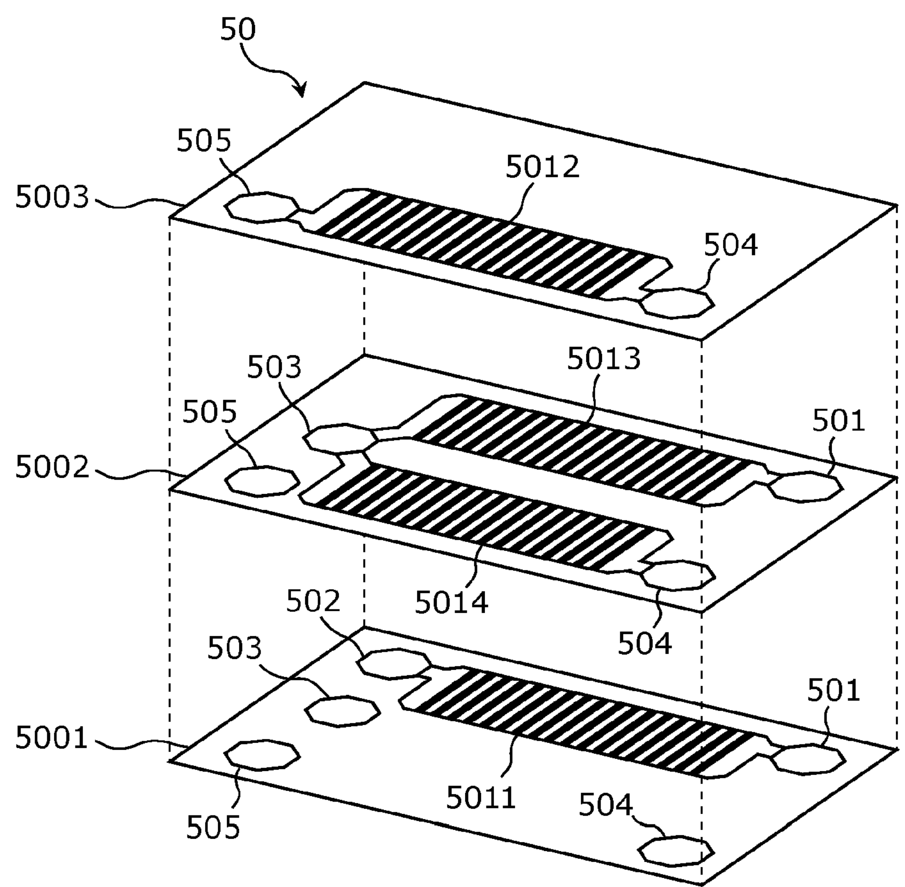
FIG. 16 is a configuration diagram of a switch circuit according to the fifth exemplary embodiment.

Now, the circuit configuration of the switch circuit 50 will be described with reference to FIG. 16. FIG. 16 is a circuit configuration diagram of the switch circuit 50 according to the fifth exemplary embodiment.

The switch circuit 50 is formed in one die having a plurality of layers including layers 5001 to 5003. The layer 5002 is disposed between the layers 5001 and 5003. The switch circuit 50 includes the terminals 501 to 505 and switches 5011 to 5014.

The switch 5011 is an example of a first switch, and is disposed in the layer 5001. The switch 5011 is a series switch connected in series to a path connecting the terminals 501 and 502, and is capable of switching between conduction and non-conduction between the terminals 501 and 502 in the layer 5001. That is, the switch 5011 is capable of switching between connection and disconnection between the antenna connection terminal 101 and the filter 61.

The switch 5012 is an example of a second switch, and is disposed in the layer 5003. The switch 5012 is a series switch connected in series to a path connecting the terminals

504 and 505, and is capable of switching between conduction and non-conduction between the terminals 504 and 505 in the layer 5003. That is, the switch 5012 is capable of switching between connection and disconnection between the antenna connection terminal 102 and the filter 62.

The switch 5013 is an example of a third switch, and is disposed in the layer 5002. The switch 5013 is a series switch connected in series to a path connecting the terminals 501 and 503, and is capable of switching between conduction and non-conduction between the terminals 501 and 503 in the layer 5002. That is, the switch 5013 is capable of switching between connection and disconnection between the antenna connection terminal 101 and the filter 63.

The switch 5014 is an example of a fourth switch, and is disposed in the layer 5002. The switch 5014 is a series switch connected in series to a path connecting the terminals 503 and 504, and is capable of switching between conduction and non-conduction between the terminals 503 and 504 in the layer 5002. That is, the switch 5014 is capable of switching between connection and disconnection between the antenna connection terminal 102 and the filter 63.

Each of the switches 5011 to 5014 includes, for example, a plurality of metal-oxide-semiconductor field-effect transistors (MOSFETs) or the like connected in series. The number of stages of series connection of the MOSFETs may be determined in accordance with a necessary withstand voltage, and is not particularly limited.

The terminals 501 to 505 arranged in the layer 5001 are connected to an external connection terminal (not illustrated) of the switch circuit 50. The terminals 501 and 503 extend from the layer 5001 to the layer 5002, and the terminals 504 and 505 extend from the layer 5001 to the layer 5003.

5.3. Connection States of RF Module 1D

A plurality of connection states of the RF module 1D having the above-described configuration are similar to those in the fourth exemplary embodiment.

Specifically, for reception of downlink signals of band A by MIMO via both the antennas 2*a* and 2*b*, the switch 5011 is set to a conductive state (i.e., an ON state) and connects the terminal 501 to the terminal 502. The switch 5012 is set to a conductive state and connects the terminal 504 to the terminal 505. The switch 5013 is set to a non-conductive state (i.e., an OFF state) and does not connect the terminal 501 to the terminal 503. The switch 5014 is set to a non-conductive state and does not connect the terminal 503 to the terminal 504.

As a result, a downlink signal of band A is transmitted from the antenna 2*a* to the RFIC 3 via the antenna connection terminal 101, the switch circuit 50, the filter 61, the low-noise amplifier 21, and the RF output terminal 121. Furthermore, a downlink signal of band A is transmitted from the antenna 2*b* to the RFIC 3 via the antenna connection terminal 102, the switch circuit 50, the filter 62, the low-noise amplifier 22, and the RF output terminal 122.

For transmission of an SRS of band A via the antenna 2*a*, the switch 5011 is set to a non-conductive state and does not connect the terminal 501 to the terminal 502. The switch 5012 is set to a non-conductive state and does not connect the terminal 504 to the terminal 505. The switch 5013 is set to a conductive state and connects the terminal 501 to the terminal 503. The switch 5014 is set to a non-conductive state and does not connect the terminal 503 to the terminal 504.

As a result, the SRS of band A is transmitted from the RFIC 3 to the antenna 2*a* via the RF input terminal 111, the PA 11, the filter 63, the switch circuit 50, and the antenna connection terminal 101.

For transmission of an SRS of band A via the antenna 2*b*, the switch 5011 is set to a non-conductive state and does not connect the terminal 501 to the terminal 502. The switch 5012 is set to a non-conductive state and does not connect the terminal 504 to the terminal 505. The switch 5013 is set to a non-conductive state and does not connect the terminal 501 to the terminal 503. The switch 5014 is set to a conductive state and connects the terminal 503 to the terminal 504.

As a result, the SRS of band A is transmitted from the RFIC 3 to the antenna 2*b* via the RF input terminal 111, the PA 11, the filter 63, the switch circuit 50, and the antenna connection terminal 102.

5.4. Advantageous Effects and the Like

As described above, the RF module 1D according to the exemplary embodiment includes the filter 61 having a pass band including band A for TDD; the filter 62 having a pass band including band A; the low-noise amplifier 21 connected to one end of the filter 61; the low-noise amplifier 22 connected to one end of the filter 62; and the switch circuit 50. The switch circuit 50 includes the terminal 501 connected to the antenna connection terminal 101, the terminal 502 connected to the other end of the filter 61, the terminal 503 connected to the RF input terminal 111 for receiving an uplink signal of band A from the outside, the terminal 504 connected to the antenna connection terminal 102, the terminal 505 connected to the other end of the filter 62, the switch 5011 capable of switching between connection and disconnection between the terminal 501 and the terminal 502, the switch 5012 capable of switching between connection and disconnection between the terminal 504 and the terminal 505, the switch 5013 capable of switching between connection and disconnection between the terminal 501 and the terminal 503, and the switch 5014 capable of switching between connection and disconnection between the terminal 503 and the terminal 504. The switch circuit 50 is formed in one die including a plurality of layers. The plurality of layers include the layer 5001 in which the switch 5011 is disposed, the layer 5002 in which the switch 5013 and the switch 5014 are disposed, and the layer 5003 in which the switch 5012 is disposed. The layer 5002 is disposed between the layer 5001 and the layer 5003.

Accordingly, the switch 5011 capable of connecting the filter 61 to the antenna connection terminal 101 and the switch 5012 capable of connecting the filter 62 to the antenna connection terminal 102 can be respectively formed in the layers 5001 and 5002 separated from each other with the layer 5002 interposed therebetween in one die. This makes it possible to improve the isolation between the path of a downlink signal from the antenna 2*a* and the path of a downlink signal from the antenna 2*b*. As a result, for reception of downlink signals of band A by MIMO, it is possible to reduce the interference between the downlink signal input from the antenna 2*a* via the antenna connection terminal 101 and the downlink signal input from the antenna 2*b* via the antenna connection terminal 102. That is, the RF module 1D is capable of improving reception sensitivity in MIMO wireless communication.

For example, in the RF module 1D according to the present embodiment, for reception of downlink signals of band A by MIMO via both the antenna connection terminals 101 and 102, the switch 5011 may connect the terminal 501 to the terminal 502, the switch 5012 may connect the terminal 504 to the terminal 505, the switch 5013 need not connect the terminal 501 to the terminal 503, and the switch 5014 need not connect the terminal 503 to the terminal 504; for transmission of an uplink signal of band A via the antenna connection terminal 101, the switch 5011 need not connect the terminal 501 to the terminal 502, the switch 5012 need not connect the terminal 504 to the terminal 505, the switch 5013 may connect the terminal 501 to the terminal 503, and the switch 5014 need not connect the terminal 503 to the terminal 504; and for transmission of an uplink signal of band A via the antenna connection terminal 102, the switch 5011 need not connect the terminal 501 to the terminal 502, the switch 5012 need not connect the terminal 504 to the terminal 505, the switch 5013 need not connect the terminal 501 to the terminal 503, and the switch 5014 may connect the terminal 503 to the terminal 504.

Accordingly, when the switches 5013 and 5014 are brought into a non-conductive state for reception of downlink signals of band A by MIMO, the interference between two downlink signals can be reduced, and the reception sensitivity can be improved. Furthermore, as a result of bringing the switch 5013 into a conductive state or bringing the switch 5014 into a conductive state, uplink signals of band A can be individually transmitted from the antennas 2*a* and 2*b*.

Sixth Exemplary Embodiment

Next, a sixth exemplary embodiment will be described. Differences between the sixth exemplary embodiment and the above-described exemplary embodiments include that the communication device includes two RF modules. Hereinafter, the sixth exemplary embodiment will be described with a focus on differences from the above-described exemplary embodiments with reference to the drawings.

Figure 17:
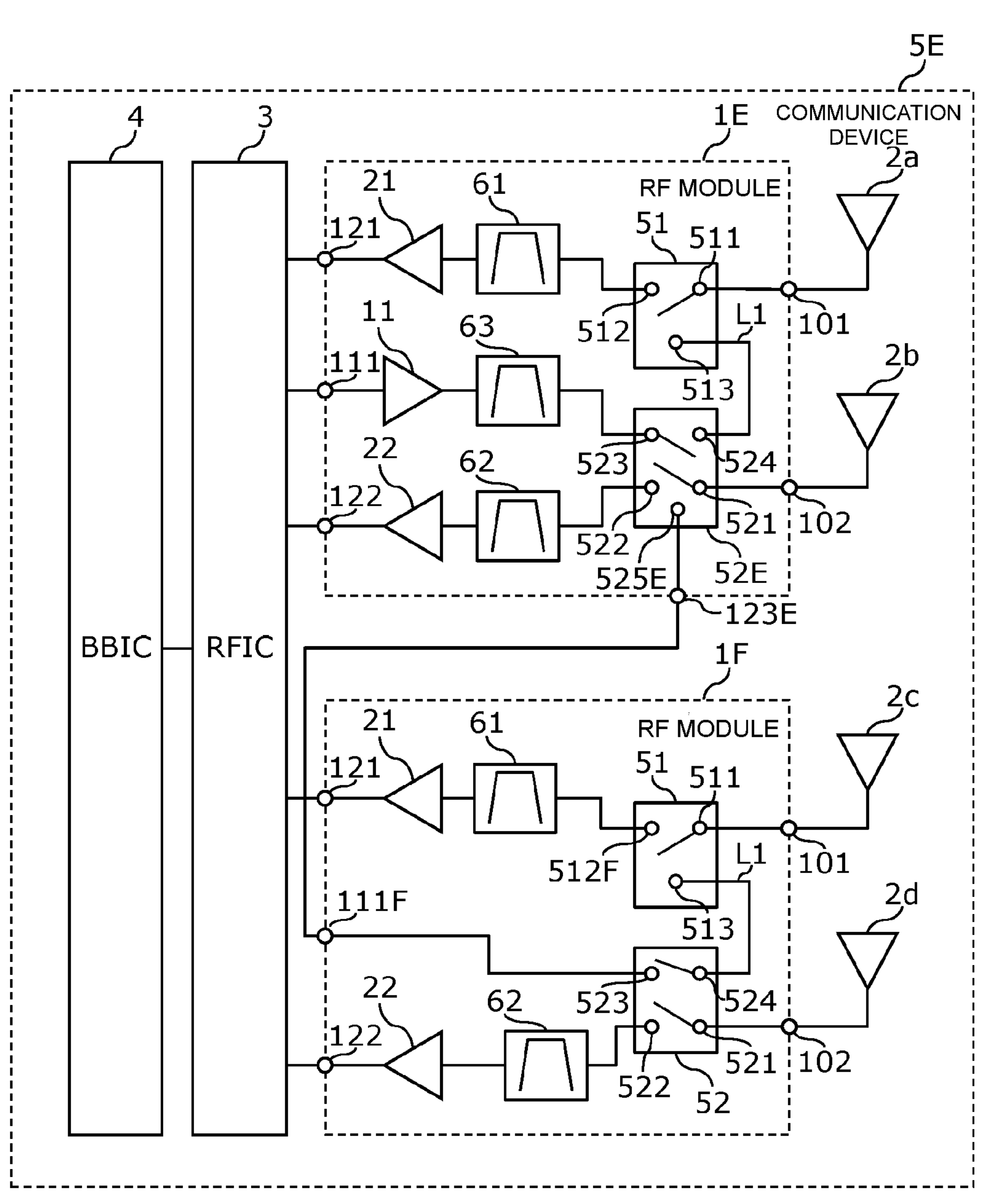
FIG. 17 is a circuit configuration diagram of two RF modules and a communication device according to a sixth exemplary embodiment.

6.1. Circuit Configurations of Two RF Modules 1E and 1F and Communication Device 5E A communication device 5E according to the exemplary embodiment is a mobile terminal that supports 4×4 downlink MIMO. The circuit configuration of the communication device 5E will be described with reference to FIG. 17. FIG. 17 is a circuit configuration diagram of two RF modules 1E and 1F and the communication device 5E according to the sixth exemplary embodiment.

6.1.1. Circuit Configuration of Communication Device 5E

The communication device 5E according to the exemplary embodiment includes the RF modules 1E and 1F, antennas 2*a* to 2*d*, an RFIC 3, and a BBIC 4.

The RF module 1E transmits RF signals between the antennas 2*a* and 2*b* and the RFIC 3. The RF module 1F transmits RF signals between the antennas 2*c* and 2*d* and the RFIC 3. The internal configurations of the RF modules 1E and 1F will be described below.

The antennas 2*c* and 2*d* are connected to the antenna connection terminals 101 and 102 of the RF module 1F, respectively. The antennas 2*c* and 2*d* each transmit an RF signal output from the RF module 1F, and receive an RF signal from the outside and output the RF signal to the RF module 1F.

In the communication device 5E according to the exemplary embodiment, the antennas 2*a* to 2*d* and the BBIC 4 are not essential constituent elements.

6.1.2. Circuit Configurations of RF Modules 1E and 1F

The circuit configurations of the RF modules 1E and 1F will be described. As illustrated in FIG. 17, the RF module 1E is different from the RF module 1 according to the above-described first exemplary embodiment in that the RF module 1E includes a switch 52E instead of the switch 52. In addition, the RF module 1F is different from the RF module 1 according to the above-described first exemplary embodiment in that the RF module 1F includes neither the PA 11 nor the filter 63. Hereinafter, a description will be given with a focus on differences from the RF module 1 according to the first exemplary embodiment.

The switch 52E of the RF module 1E includes a terminal 525E in addition to terminals 521 to 524. The terminal 525E is connected to an RF output terminal 123E. The RF output terminal 123E is used to provide an amplified uplink signal (e.g., SRS) of band A to the RF module 1F, and is included in the plurality of post electrodes 150. The switch 52E is capable of connecting the terminal 523 to the terminal 525E in response to, for example, a control signal from the RFIC 3.

The RF module 1F includes an RF input terminal 111F. The RF input terminal 111F is a terminal for receiving an amplified uplink signal of band A, and is connected to the RF output terminal 123E of the RF module 1E outside the RF module 1F. The terminal 523 of the switch 52 of the RF module 1F is connected to the RF input terminal 111F included in the plurality of post electrodes 150.

The RF module 1E is connectable to the antennas 2*c* and 2*d* of the RF module 1F via the RF output terminal 123E and the RF input terminal 111F.

6.2. Advantageous Effects and the Like

With use of the RF modules 1E and 1F, the communication device 5E is capable of simultaneously receiving four downlink signals by the four antennas 2*a* to 2*d*, and is capable of individually transmitting SRSs from the four antennas 2*a* to 2*d*.

The RF modules 1E and 1F may be reception modules compatible with the same band or may be modules compatible with different bands. Specifically, one of the RF modules 1E and 1F may be compatible with n77 for 5G NR, and the other of the RF modules 1E and 1F may be compatible with n79 for 5G NR.

Other Exemplary Embodiments

The RF module and communication device according to the present disclosure have been described above on the basis of exemplary embodiments. The RF module and communication device according to the present disclosure are not limited to the above exemplary embodiments. Other exemplary embodiments implemented by combining any constituent elements in the above exemplary embodiments, modifications obtained by applying various changes conceived by those skilled in the art to the above exemplary embodiments without departing from the scope of the present disclosure, and various devices including the above-described RF module and communication device are also included in the scope of the present disclosure.

For example, in the circuit configurations of the RF modules and communication devices according to the above exemplary embodiments, another circuit element, wiring line, and the like may be inserted between individual circuit elements and paths connecting signal paths disclosed in the drawings. For example, in the first exemplary embodiment, an impedance matching circuit may be inserted at least one of between the filter 61 and the switch 51, between the filter 62 and the switch 52, or between the filter 63 and the switch 52. The impedance matching circuit may be inserted, for example, at least one of between the PA 11 and the filter 63, between the low-noise amplifier 21 and the filter 61, or between the low-noise amplifier 22 and the filter 62. The impedance matching circuit may include, for example, an inductor and/or a capacitor.

The arrangement of components in each of the above-described embodiments is merely an example, and the present disclosure is not limited thereto. For example, in the above-described first exemplary embodiment, all the circuit components may be disposed on the main surface 91*a*. That is, the module substrate 91 may be a single-sided mounting substrate.

The present disclosure can be widely used, as an RF module to be disposed in a front end portion, in communication devices such as mobile phones.

What is claimed is:

1. A radio frequency module comprising:

a first filter having a pass band including a time division duplex (TDD) band;

a second filter having a pass band including the TDD band;

a first low-noise amplifier including an input terminal connected to one end of the first filter, and an output terminal connected to a first radio frequency output terminal to externally provide a downlink signal of the TDD band;

a second low-noise amplifier including an input terminal connected to one end of the second filter, and an output terminal connected to a second radio frequency output terminal to externally provide a downlink signal of the TDD band;

a first switch including a first terminal connected to a first antenna connection terminal, a second terminal connected to an other end of the first filter, and a third terminal connected to a radio frequency input terminal to receive an external uplink signal of the TDD band; and a second switch including a fourth terminal connected to a second antenna connection terminal, a fifth terminal connected to an other end of the second filter, and a sixth terminal connected to the radio frequency input terminal, wherein the first switch is formed in a first die, and the second switch is formed in a second die different from the first die, the second switch includes a seventh terminal connected to the third terminal of the first switch via a wiring line disposed outside the first die and outside the second die, and the third terminal of the first switch is connected to the radio frequency input terminal via the second switch.

2. The radio frequency module according to claim 1, wherein in reception of downlink signals of the TDD band by Multiple Input Multiple Output (MIMO) via both the first antenna connection terminal and the second antenna connection terminal, the first switch connects the first terminal to the second terminal and does not connect the first terminal to the third terminal, and the second switch connects the fourth terminal to the fifth terminal and does not connect the fourth terminal to the sixth terminal, in transmission of an uplink signal of the TDD band via the first antenna connection terminal, the first switch connects the first terminal to the third terminal and does not connect the first terminal to the second terminal, and the second switch does not connect the fourth terminal to the sixth terminal and connects the seventh terminal to the sixth terminal, and in transmission of an uplink signal of the TDD band via the second antenna connection terminal, the second switch connects the fourth terminal to the sixth terminal, does not connect the fourth terminal to the fifth terminal, and does not connect the seventh terminal to the sixth terminal.

3. The radio frequency module according to claim 2, wherein the TDD band is a frequency band for 5th Generation New Radio (5G NR), and the uplink signal is a sounding reference signal.

4. The radio frequency module according to claim 1, wherein the first switch includes a first ground terminal connected to ground, and the second switch includes a second ground terminal connected to ground.

5. The radio frequency module according to claim 1, wherein the first switch includes a first ground terminal connected to ground, the second switch includes a second ground terminal connected to ground, in reception of downlink signals of the TDD band by Multiple Input Multiple Output (MIMO) via both the first antenna connection terminal and the second antenna connection terminal, the first switch connects the first terminal to the second terminal, does not connect the first terminal to the third terminal, and connects the third terminal to the first ground terminal, and the second switch connects the fourth terminal to the fifth terminal, does not connect the fourth terminal to the sixth terminal, and connects the seventh terminal to the second ground terminal, in transmission of an uplink signal of the TDD band via the first antenna connection terminal, the first switch connects the first terminal to the third terminal and does not connect the first terminal to the second terminal, and the second switch does not connect the fourth terminal to the sixth terminal and connects the seventh terminal to the sixth terminal, and in transmission of an uplink signal of the TDD band via the second antenna connection terminal, the second switch connects the fourth terminal to the sixth terminal, does not connect the fourth terminal to the fifth terminal, and does not connect the seventh terminal to the sixth terminal.

6. The radio frequency module according to claim 5, wherein the TDD band is a frequency band for 5th Generation New Radio (5G NR), and the uplink signal is a sounding reference signal.

7. The radio frequency module according to claim 1, wherein at least one of the third terminal of the first switch or the sixth terminal of the second switch is disposed between the second terminal of the first switch and the fifth terminal of the second switch in a plan view.

8. The radio frequency module according to claim 1, further comprising:

a third filter connected to the radio frequency input terminal and having a pass band including the TDD band, wherein the third terminal of the first switch and the sixth terminal of the second switch are connected to the radio frequency input terminal via the third filter.

9. The radio frequency module according to claim 8, further comprising:

a power amplifier connected between the third filter and the radio frequency input terminal.

10. The radio frequency module according to claim 1, wherein the TDD band is n41, n77, n78, or n79 for 5th Generation New Radio (5G NR).

11. A communication device comprising:

a signal processing circuit configured to process a radio frequency signal; and the radio frequency module according to claim 1, the radio frequency module being configured to transmit the radio frequency signal between a plurality of antennas and the signal processing circuit.

12. The radio frequency module according to claim 1, wherein the first switch and the second switch are metal-oxide-semiconductor field-effect transistor (MOSFET) switches.

13. The radio frequency module according to claim 1, wherein the first switch is connected to the first filter via an impedance matching circuit.

14. The radio frequency module according to claim 1, wherein the second switch is connected to the second filter via an impedance matching circuit.

15. A radio frequency module comprising:

a first filter having a pass band including a time division duplex (TDD) band;

a second filter having a pass band including the TDD band;

a first low-noise amplifier including an input terminal connected to one end of the first filter, and an output terminal connected to a first radio frequency output terminal to externally provide a downlink signal of the TDD band;

a second low-noise amplifier including an input terminal connected to one end of the second filter, and an output terminal connected to a second radio frequency output terminal to externally provide a downlink signal of the TDD band;

a first switch configured to switch between connection and disconnection between a first antenna connection terminal and an other end of the first filter;

a second switch configured to switch between connection and disconnection between a second antenna connection terminal and an other end of the second filter;

a third switch configured to switch between connection and disconnection between the first antenna connection terminal and a radio frequency input terminal to receive an external uplink signal of the TDD band; and a fourth switch configured to switch between connection and disconnection between the second antenna connection terminal and the radio frequency input terminal, wherein the first antenna connection terminal and the second antenna connection terminal are connected to each other via the third switch and the fourth switch.

16. The radio frequency module according to claim 15, wherein in reception of downlink signals of the TDD band by Multiple Input Multiple Output (MIMO) via both the first antenna connection terminal and the second antenna connection terminal, the first switch connects the first antenna connection terminal to the other end of the first filter, the second switch connects the second antenna connection terminal to the other end of the second filter, the third switch does not connect the first antenna connection terminal to the radio frequency input terminal, and the fourth switch does not connect the second antenna connection terminal to the radio frequency input terminal, in transmission of an uplink signal of the TDD band via the first antenna connection terminal, the first switch does not connect the first antenna connection terminal to the other end of the first filter, the second switch does not connect the second antenna connection terminal to the other end of the second filter, the third switch connects the first antenna connection terminal to the radio frequency input terminal, and the fourth switch does not connect the second antenna connection terminal to the radio frequency input terminal, and in transmission of an uplink signal of the TDD band via the second antenna connection terminal, the first switch does not connect the first antenna connection terminal to the other end of the first filter, the second switch does not connect the second antenna connection terminal to the other end of the second filter, the third switch does not connect the first antenna connection terminal to the radio frequency input terminal, and the fourth switch connects the second antenna connection terminal to the radio frequency input terminal.

17. The radio frequency module according to claim 15, wherein the first switch, the second switch, the third switch, and the fourth switch are metal-oxide-semiconductor field-effect transistor (MOSFET) switches.

18. A radio frequency module comprising:

a first filter having a pass band including a time division duplex (TDD) band;

a second filter having a pass band including the band;

a first low-noise amplifier including an input terminal connected to one end of the first filter, and an output terminal connected to a first radio frequency output terminal to externally provide a downlink signal of the TDD band;

a second low-noise amplifier including an input terminal connected to one end of the second filter, and an output terminal connected to a second radio frequency output terminal to externally provide a downlink signal of the TDD band; and a switch circuit, wherein the switch circuit includes a first terminal connected to a first antenna connection terminal, a second terminal connected to an other end of the first filter, a third terminal connected to a radio frequency input terminal for receiving an uplink signal of the band from an outside, a fourth terminal connected to a second antenna connection terminal, a fifth terminal connected to an other end of the second filter, a first switch configured to switch between connection and disconnection between the first terminal and the second terminal, a second switch configured to switch between connection and disconnection between the fourth terminal and the fifth terminal, a third switch configured to switch between connection and disconnection between the first terminal and the third terminal, and a fourth switch configured to switch between connection and disconnection between the third terminal and the fourth terminal, and the switch circuit is formed in one die including a plurality of layers, the plurality of layers including a first layer in which the first switch is disposed, a second layer in which the third switch and the fourth switch are disposed, and a third layer in which the second switch is disposed, the second layer being disposed between the first layer and the third layer.

19. The radio frequency module according to claim 18, wherein in reception of downlink signals of the TDD band by Multiple Input Multiple Output (MIMO) via both the first antenna connection terminal and the second antenna connection terminal, the first switch connects the first terminal to the second terminal, the second switch connects the fourth terminal to the fifth terminal, the third switch does not connect the first terminal to the third terminal, and the fourth switch does not connect the third terminal to the fourth terminal, in transmission of an uplink signal of the TDD band via the first antenna connection terminal, the first switch does not connect the first terminal to the second terminal, the second switch does not connect the fourth terminal to the fifth terminal, the third switch connects the first terminal to the third terminal, and the fourth switch does not connect the third terminal to the fourth terminal, and in transmission of an uplink signal of the TDD band via the second antenna connection terminal, the first switch does not connect the first terminal to the second terminal, the second switch does not connect the fourth terminal to the fifth terminal, the third switch does not connect the first terminal to the third terminal, and the fourth switch connects the third terminal to the fourth terminal.

20. The radio frequency module according to claim 18, wherein the first switch, the second switch, the third switch, and the fourth switch are metal-oxide-semiconductor field-effect transistor (MOSFET) switches.

* * * * *